(12) United States Patent
Choi et al.

(10) Patent No.: US 11,937,462 B2
(45) Date of Patent: Mar. 19, 2024

(54) ELECTROLUMINESCENT DISPLAY DEVICE COMPRISING BANK LAYER WITH GROOVES THEREIN

(71) Applicant: LG DISPLAY CO., LTD., Seoul (KR)

(72) Inventors: Jeong-Mook Choi, Paju-si (KR); Nack-Youn Jung, Paju-si (KR); Hee-Jin Kim, Paju-si (KR); Hak-Min Lee, Paju-si (KR); Myung-O Joo, Paju-si (KR); Sung-Soo Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/678,085

(22) Filed: Feb. 23, 2022

(65) Prior Publication Data
US 2022/0181414 A1    Jun. 9, 2022

Related U.S. Application Data

(62) Division of application No. 16/557,010, filed on Aug. 30, 2019, now Pat. No. 11,289,555.

(30) Foreign Application Priority Data

Dec. 3, 2018 (KR) .......................... 10-2018-0153549

(51) Int. Cl.
*H10K 59/122* (2023.01)
*H10K 59/131* (2023.01)
(Continued)

(52) U.S. Cl.
CPC ......... *H10K 59/122* (2023.02); *H10K 59/131* (2023.02); *H10K 59/88* (2023.02); *H10K 71/135* (2023.02)

(58) Field of Classification Search
None
See application file for complete search history.

(56) References Cited

U.S. PATENT DOCUMENTS

| 2016/0079322 A1* | 3/2016 | Kim .................... H01L 27/3246 438/34 |
| 2018/0174515 A1 | 6/2018 | Joo |
| 2019/0355939 A1 | 11/2019 | Fukuda et al. |

FOREIGN PATENT DOCUMENTS

| CN | 105789246 A | 7/2016 |
| CN | 108206201 A | 6/2018 |

(Continued)

OTHER PUBLICATIONS

German Office Action dated Feb. 17, 2023 issued in Patent Application No. 10 2019 132 771.7 (9 pages).
(Continued)

*Primary Examiner* — Daniel Whalen
(74) *Attorney, Agent, or Firm* — POLSINELLI PC

(57) ABSTRACT

An electroluminescent display device includes an electroluminescent display device includes a substrate; a first pixel row on the substrate including a first plurality of pixels arranged along a first direction; a second pixel row on the substrate including a second plurality of pixels arranged along the first direction, the second pixel row being spaced apart from the first pixel row in a second direction; a first groove between the first and second pixel rows; and a light emitting diode in each pixel of the first and second pixel rows, wherein the first groove includes a first portion at one end of the first pixel row, a second portion at the other end of the first pixel row and a third portion between the first and second portions, and wherein third portion is smaller than the first portion and greater than the second portion.

19 Claims, 9 Drawing Sheets

(51) Int. Cl.
*H10K 59/88* (2023.01)
*H10K 71/13* (2023.01)

(56) References Cited

FOREIGN PATENT DOCUMENTS

| EP | 3321985 A1 | 5/2018 |
| EP | 3336916 A1 | 6/2018 |
| KR | 10-2016-0032749 A | 3/2016 |
| KR | 10-2018-0070367 A | 6/2018 |

OTHER PUBLICATIONS

Chinese Office Action dated Jan. 5, 2023 issued in Patent Application No. 201910744563.4 w/English Translation (16 pages).
Korean Office Action dated Sep. 6, 2023 issued in Patent Application No. 10-2018-0153549 (6 pages).

* cited by examiner

100

300

ELECTROLUMINESCENT DISPLAY DEVICE COMPRISING BANK LAYER WITH GROOVES THEREIN

CROSS-REFERENCE TO RELATED APPLICATIONS

The present application is a divisional of U.S. patent application Ser. No. 16/557,010, filed Aug. 30, 2019, which claims priority to Korean Patent Application No. 10-2018-0153549 filed in the Republic of Korea on Dec. 3, 2018, which are hereby incorporated by reference in their entirety.

BACKGROUND

Field of Technology

The present disclosure relates to a display device, and more particularly, to an electroluminescent display device being capable of improving a uniformity of an emitting layer.

Discussion of Background

An electroluminescent (EL) display device among new flat panel display devices is a self-emission type such that there are advantages in a viewing angle and a contrast ratio in comparison to a liquid crystal display device. In addition, since a backlight unit is not required in the EL display device, there are advantages of a thin profile and low power consumption.

The EL display device includes a light emitting diode, and the light emitting diode includes first and second electrodes and an emitting layer therebetween.

Generally, the emitting layer is formed by a thermal deposition process. However, there is a limitation in the application of the thermal deposition process for the large size EL display device.

Recently, a process for the emitting layer is introduced to address this limitation. However, this proposed process introduces a thickness non-uniformity in each pixel of the emitting layer such that the display quality and the lifespan of the EL display device adversely affected.

SUMMARY

Accordingly, the present disclosure is directed to an electroluminescent display device that substantially obviates one or more of the problems due to limitations and disadvantages described above.

Additional features and advantages of the present disclosure will be set forth in the description which follows, and in part will be apparent from the description, or may be learned by practicing the present disclosure. The objectives and other advantages will be realized and attained by the structure particularly pointed out in the written description and claims as well as the appended drawings.

To achieve these and other advantages and in accordance with the purpose of the present disclosure, as embodied and broadly described herein, an electroluminescent display device includes an electroluminescent display device includes a substrate; a first pixel row on the substrate including a first plurality of pixels arranged along a first direction; a second pixel row on the substrate including a second plurality of pixels arranged along the first direction, the second pixel row being spaced apart from the first pixel row in a second direction; a first groove between the first and second pixel rows; and a light emitting diode in each pixel of the first and second pixel rows, wherein the first groove includes a first portion at one end of the first pixel row, a second portion at the other end of the first pixel row and a third portion between the first and second portions, and wherein the third portion is smaller than the first portion and greater than the second portion.

In another aspect, the first, second and third portions respectively have first, second and third widths along the second direction, and the third width is smaller than the first width and greater than the second width.

In another aspect, a width of the first groove gradually decreases along the first direction.

In another aspect, the first, second and third portion are connected to each other.

In another aspect, the first, second and third portion are spaced apart from each other.

In another aspect, the first groove gradually decreases along the first direction.

In another aspect, the electroluminescent display device further includes a third pixel row on the substrate including a third plurality of pixels arranged along the first direction, the third pixel row being spaced apart from the second pixel row along the second direction; and a second groove between the second and third pixel rows, wherein the second groove includes a fourth portion at one end of the second pixel row, a fifth portion at the other end of the second pixel row and a sixth portion between the fourth and fifth portions, and wherein the sixth portion is smaller than the fourth portion and greater than the fifth portion.

In another aspect, the fourth, fifth and sixth portions respectively have fourth, fifth and sixth widths along the second direction, and the sixth width is smaller than the fourth width and greater than the fifth width.

In another aspect, the electroluminescent display device further includes a thin film transistor on the substrate and each pixel of the first plurality of pixels and the second plurality of pixels; an insulating layer on the thin film transistor; and a bank layer on the insulating layer and surrounding each pixel of the first plurality of pixels and the second plurality of pixels, wherein the light emitting diode includes a first electrode, an emitting layer on the first electrode and a second electrode covering the emitting layer, and wherein the first groove is formed in the bank layer.

In another aspect, the electroluminescent display device further includes a material pattern in the first groove, wherein the material pattern is configured to contact the insulating layer and the second electrode.

In another aspect, the second electrode in the first groove is configured to contact the insulating layer.

In another aspect, the bank layer includes a first bank layer positioned between pixels in the first pixel row and having a first thickness and a second bank layer positioned between the first and second pixel rows and has a second thickness greater than the first thickness.

In another aspect, the first bank layer has a single-layered structure, and the second bank layer has a double-layered structure.

In another aspect, the emitting layers in the pixels in the first pixel row are connected to each other, and the emitting layers in the pixel of the first pixel row and the pixel of the second pixel row are separated.

In one aspect, an electroluminescent display device includes a substrate; a first pixel row on the substrate including a plurality of first pixels arranged along a first direction; a second pixel row on the substrate including a plurality of second pixels arranged along the first direction, the second pixel row being spaced apart from the first pixel row in a second direction; a third pixel row on the substrate including a plurality of third pixels arrange along the first direction, the third pixel row positioned between the first and second pixel rows; a first groove between the first and third pixel rows; a second groove between the second and third pixel rows; and a light emitting diode in each of the first pixels, the second pixels and the third pixels, wherein the first groove is greater than the second groove.

In another aspect, in the second direction, the first groove has a width greater than the second groove.

In another aspect, a length of the first groove is substantially equal to a length of the first pixel row, and a length of the second groove is substantially equal to a length of the second pixel row.

In another aspect, the first groove includes a plurality of first groove patterns respectively corresponding to the plurality of first pixels and spaced apart from each other, and the second groove includes a plurality of second groove patterns respectively corresponding to the plurality of second pixels and spaced apart from each other.

In another aspect, the electroluminescent display device further includes a fourth pixel row spaced apart from the second pixel row in the second direction including a plurality of fourth pixels arranged along the first direction; and a third groove between the second and fourth pixel rows, wherein the third groove has a width smaller than the second groove.

In another aspect, the electroluminescent display device further includes a thin film transistor on the substrate and in each of the first plurality of pixels, the second plurality of pixels and the third plurality of pixels; an insulating layer on the thin film transistor; and a bank layer on the insulating layer and surrounding each of the first plurality of pixels, the second plurality of pixels and the third plurality of pixels, wherein the light emitting diode includes a first electrode, an emitting layer on the first electrode and a second electrode covering the emitting layer, and wherein the first and second grooves are formed in the bank layer.

In another aspect, the electroluminescent display device further includes a material pattern in the first and second grooves, wherein the material pattern is configured to contact the insulating layer and the second electrode.

In another aspect, the second electrode in the first and second grooves is configured to contact the insulating layer.

In another aspect, the bank layer includes a first bank layer positioned between the first plurality of pixels having a first thickness and a second bank layer positioned between the first pixel row and the third pixel row and having a second thickness, and wherein the second thickness is greater than the first thickness.

In another aspect, the first bank layer has a single-layered structure, and the second bank layer has a double-layered structure.

In another aspect, the emitting layers in the first pixels are connected to each other, and the emitting layers in the first and second pixels are separated.

In one aspect, a display device includes a substrate having a plurality of pixels in a first direction and a second direction; and a first bank in between two adjacent ones of the plurality of pixels in the first direction and the second direction; and a second bank on the first bank between any two adjacent ones of the plurality of pixels in the first direction, the second bank including at least one groove with a continually decreasing width from one end of the substrate to an opposite end of the substrate.

In another aspect, the continually decreasing width is in the same direction as a direction in which a solution process is applied to the substrate.

In another aspect, the display device further includes a non-display area surrounding display area of the substrate, the non-display area including a plurality of dummy pixels for controlling drying periods of the solution process.

In another aspect, the continually decreasing width is in the first direction.

In another aspect, the continually decreasing width is in the second direction.

In another aspect, the second bank is configured to block leakage of liquid phase material deposited on any column or row of pixels to a corresponding adjacent column or row.

In another aspect, the display device further includes a plurality of data lines or a plurality of power lines corresponding to the second bank.

In another aspect, the display device further includes a plurality of gate lines corresponding to the first bank.

It is to be understood that both the foregoing general description and the following detailed description are exemplary and explanatory and are intended to provide further explanation of the present disclosure as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Figure 1:
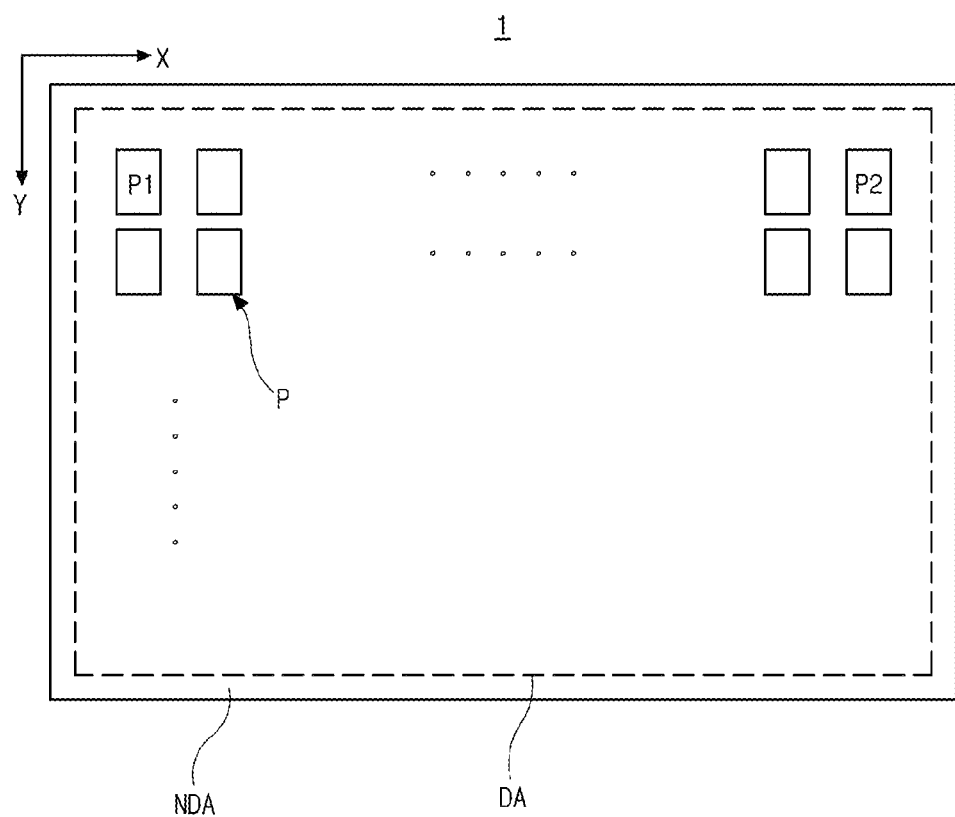
FIG. 1 is a schematic view of a thickness non-uniformity problem in an emitting layer.

Hereinafter, some example embodiments of the present disclosure will be described in detail with reference to the accompanying illustrative drawings. While specific implementations are discussed, it should be understood that this is done for illustration purposes only. A person skilled in the relevant art will recognize that other components and configurations may be used without parting from the spirit and scope of the disclosure.

In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

Reference to "one example" or "an example" means that a particular feature, structure, or characteristic described in connection with the example is included in at least one example of the disclosure. The appearances of the phrase "in one example" in various places in the specification are not necessarily all referring to the same example, nor are separate or alternative example mutually exclusive of other examples. Moreover, various features are described which may be exhibited by some examples and not by others. Similarly, various requirements are described which may be requirements for some examples but not other examples.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various examples given in this specification.

Without intent to limit the scope of the disclosure, examples of instruments, apparatus, methods and their related results according to the examples of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

In addition, terms, such as first, second, A, B, (a), (b) or the like may be used herein when describing components of the present disclosure. These terms are merely used to distinguish one component from other components, and the property, order, sequence and the like of the corresponding component are not limited by the corresponding term. For example, a first element could be termed a second element, and similarly, a second element could be termed a first element, without departing from the scope of this disclosure. As used herein, the term "and/or," includes any and all combinations of one or more of the associated listed items. In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

In the same context, it will be understood that when an element is referred to as being formed "on" or "under" another element, not only can it be directly formed on or under another element, but it can also be indirectly formed on or under another element via an intervening element. By contrast, when an element is referred to as being "directly on," or "directly under," to another element, there are no intervening elements present.

The terminology used herein is for the purpose of describing particular examples only and is not intended to be limiting. As used herein, the singular forms "a", "an", and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of examples. However, it will be understood by one of ordinary skill in the art that examples may be practiced without these specific details. For example, systems may be shown in block diagrams so as not to obscure the examples in unnecessary detail. In other instances, well-known processes, structures and techniques may be shown without unnecessary detail in order to avoid obscuring example examples.

In the following description, illustrative examples will be described with reference to acts and symbolic representations of operations (e.g., in the form of flow charts, flow diagrams, data flow diagrams, structure diagrams, block diagrams, etc.) that may be implemented as program services or functional processes include routines, programs, objects, components, data structures, etc., that perform particular tasks or implement particular abstract data types and may be implemented using hardware at network elements. Non-limiting examples of such hardware may include one or more Central Processing Units (CPUs), digital signal processors (DSPs), application-specific-integrated-circuits, field programmable gate arrays (FPGAs), computers or the like.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

For clarity of explanation, in some instances the present technology may be presented as including individual functional blocks including functional blocks comprising devices, device components, steps or routines in a method embodied in software, or combinations of hardware and software.

In some examples, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

As mentioned above, when the emitting layer is formed by the solution process using a liquid phase material (e.g., organic soluble material), the emitting layer has a thickness deviation according to a position of a pixel region because the solvent concentration in air is different according to the position of the pixel region. It will be explained in more detail.

FIG. 1 is a schematic view of a thickness non-uniformity problem in an emitting layer.

Referring to FIG. 1, the EL display device 1 includes a substrate (not shown), where a display area DA and a non-display area NDA at a periphery of the display area DA are defined, and a plurality of pixels P are arranged along a first direction X and a second direction Y in the display area DA of the substrate.

In one example, the non-display area NDA may have a plurality of "dummy" pixels arranged along the first direction X and the second direction Y surrounding the display area DA. These "dummy" pixels may function for purposes of controlling drying periods during the solution process, which will be further described below.

When the emitting layer is formed by the process described above, an inkjet head, for example, is scanned from an end of the substrate to the other end of the substrate along the first direction X to coat (deposit) an emitting material solution onto each pixel P. For example, the coating process starts at a first pixel P1 and is ended at a second pixel P2.

After the coating (depositing) process is finished, the substrate is transferred into a vacuum dry chamber for a vacuum dry process. Before the substrate is transferred into the vacuum dry chamber, the first pixel P1 is present in a natural dry condition (air dry condition) for a first period, and the second pixel P2 is present in the natural dry condition for a second period being shorter than the first period.

Namely, the first and second pixels P1 and P2 undergo different natural dry periods such that the emitting layer in the first and second pixels P1 and P2 are different in thickness.

Accordingly, in the EL display device 1, the emitting layer in each pixel P has a thickness deviation such that the display quality and the lifespan of the EL display device 1 are decreased.

Reference will now be made in detail to the preferred embodiments, examples of which are illustrated in the accompanying drawings.

Figure 2:
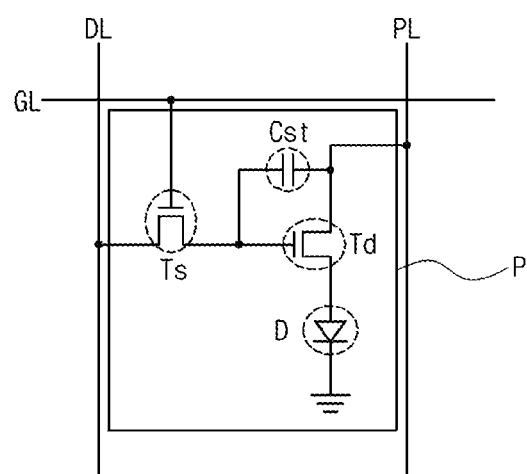
FIG. 2 is a schematic circuit diagram of an EL display device, according to an aspect of the present disclosure.

FIG. 2 is a schematic circuit diagram of an EL display device according to an aspect of the present disclosure.

As shown in FIG. 2, an EL display device includes a gate line GL, a data line DL, a power line PL, a switching thin film transistor (TFT) Ts, a driving TFT Td, a storage capacitor Cst, and an light emitting diode D. The gate line GL and the data line DL cross each other to define a pixel region P.

The switching TFT Ts is connected to the gate and data line GL and DL, and the driving TFT Td and the storage capacitor Cst are connected to the switching TFT Ts and the power line PL. The light emitting diode D is connected to the driving TFT Td.

In the EL display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the light emitting diode D from the power line PL. As a result, the light emitting diode D emits light. In this case, when the driving TFT Td is turned on, a level of an electric current applied from the power line PL to the light emitting diode D is determined such that the light emitting diode D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the light emitting diode D is maintained to next frame. Accordingly, the EL display device displays an image.

Figure 3:
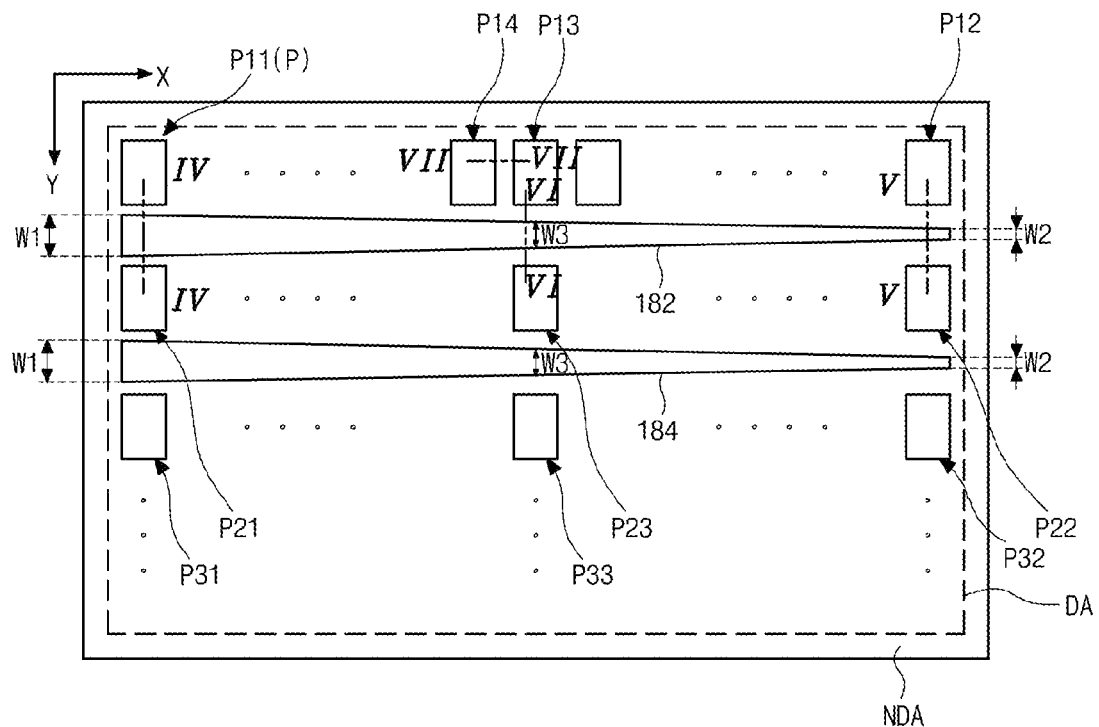
FIG. 3 is a schematic plane view of an EL display device, according to an aspect of the present disclosure.

FIG. 3 is a schematic plane view of an EL display device according to an aspect of the present disclosure.

As shown in FIG. 3, the EL display device 100 includes a substrate (not shown) where a display area DA and a non-display area NDA at a periphery of the display area DA are defined. In the display area DA of the substrate, a plurality of pixels P11, P12, P13 and P14 are arranged in a first pixel row along a first direction X, and a plurality of pixels P21, P22 and P23 are arrange in a second pixel row along the first direction X. A plurality of pixels P31, P32 and P33 are arranged in a third pixel row along the first direction X. In addition, a first groove (or indent) 182 is disposed between the first pixel row and the second pixel row, and a second groove (or indent) 184 is disposed between the second pixel row and the third pixel row.

The first pixel row includes a first pixel P11 at one end of the display area DA, a second pixel P12 at the other end of the display area DA and a third pixel P13 between the first and second pixels P11 and P12. A length of the first groove 182 may be substantially equal to that of the first pixel row.

The second pixel row is spaced apart from the first pixel row along the second direction Y and includes a first pixel P21 at one end of the display area DA, a second pixel P22 at the other end of the display area DA and a third pixel P23 between the first and second pixels P21 and P22. A length of the second groove 282 may be substantially equal to that of the second pixel row.

The third pixel row includes a first pixel P31 at one end of the display area DA, a second pixel P32 at the other end of the display area DA and a third pixel P33 between the first and second pixels P31 and P32. The third pixel row is spaced apart from the second pixel row along the second direction Y such that the second pixel row is positioned between the first and third pixel rows.

Although not shown, a light emitting diode including first and second electrodes and an emitting layer therebetween is formed in each pixel P.

The emitting layer is formed by a solution process using a liquid phase emitting material. Namely, the emitting layer is formed by coating an emitting material dissolved in a solvent and drying the solvent. For example, the solution process may be an inkjet coating process, a slit coating process, a spin coating process, a printing process or a drop coating process, but it is not limited thereto.

For example, an inkjet head (not shown) moves along the first direction X to coat the emitting material solution in each pixel P. In the first pixel row, the coating process is performed from the first pixel P11 to the second pixel P12.

An area in a plane view of each of the first and second grooves 182 and 184 is decreased along the first direction X, i.e., a scanning direction of the inkjet head in the solution process. The area in a plane view of each of the first and second grooves 182 and 184 is defined as "a plane view area". The plane view area of the first and second grooves 182 and 184 is an area of a top portion or a bottom portion. The plane view area of the first and second grooves 182 and 184 may mean a surface area of the top portion. Namely, each of the first and second grooves 182 and 184 has a first width w1 along the second direction Y at a scan starting position and a second width w2, which is smaller than the first width w1, along the second direction Y at a scan ending position. In addition, each of the first and second grooves 182 and 184 has a third width w3, which is smaller than the first width w1 and greater than the second width w2, along the second direction Y at a position between the scan starting position and the scan ending position.

For example, the first groove 182 may have the first width w1 along the second direction Y corresponding to the first pixel P11 at one end of the first pixel row, the second width w2, which is smaller than the first width w1, along the second direction Y corresponding to the second pixel P12 at the other end of the first pixel row and the third width w3, which is smaller than the first width w1 and greater than the second width w2, along the second direction Y corresponding to the third pixel P13 between the first and second pixels P11 and P12.

In other words, the first groove 182 may include a first portion having the first width w1 along the second direction Y corresponding to one end of the first pixel row, a second portion having the second width w2, which is smaller than the first width w1, along the second direction Y corresponding to the other end of the first pixel row and a third portion having the third width w3, which is smaller than the first width w1 and greater than the second width w2, along the second direction Y in a space between the first and second portions. As a result, in the first groove 182, the plane view area (surface area) of the third portion is smaller than that of the first portion and greater than that of the second portion.

In addition, the second groove 184 may include a first portion having the first width w1 along the second direction Y corresponding to one end of the second pixel row, a second portion having the second width w2, which is smaller than the first width w1, along the second direction Y corresponding to the other end of the second pixel row and a third portion having the third width w3, which is smaller than the first width w1 and greater than the second width w2, along the second direction Y in a space between the first and second portions. As a result, in the second groove 184, the plane view area of the third portion is smaller than that of the first portion and greater than that of the second portion.

When the emitting layer of the light emitting diode is formed by the solution process (coating process) using the liquid phase emitting material solution, the emitting material solution or the solvent is coated in the first and second grooves 182 and 184.

Since the first groove 182 has a plane view area deviation along the first direction X, i.e., the scanning direction, the evaporation rate of the solvent is also different along the first direction X. Namely, the evaporation of the solvent in the first groove 182 has a first rate corresponding to the first pixel P11, a second rate corresponding to the second pixel P12 and a third rate, which is smaller than the first rate and greater than the second rate, corresponding to the third pixel P13.

Accordingly, the solvent saturation rate in a region corresponding to the third pixel P13 is smaller than that in a region corresponding to the first pixel P11 and greater than that in a region corresponding to the second pixel P12.

As mentioned above, in the solution process, the first to third pixels P11 to P13 have a difference in the natural dry period before being transferred into the vacuum dry chamber. However, in the EL display device 100, since the solvent saturation rate in the regions corresponding to the first to third pixels P11 to P13 is controlled by the grooves 182 and 184, which has a difference in the width (plane view area), the natural dry period of the first to third pixels P11 to P13 is uniformed.

Accordingly, the thickness non-uniformity problem resulting from different natural dry periods is prevented or minimized.

Figure 4:
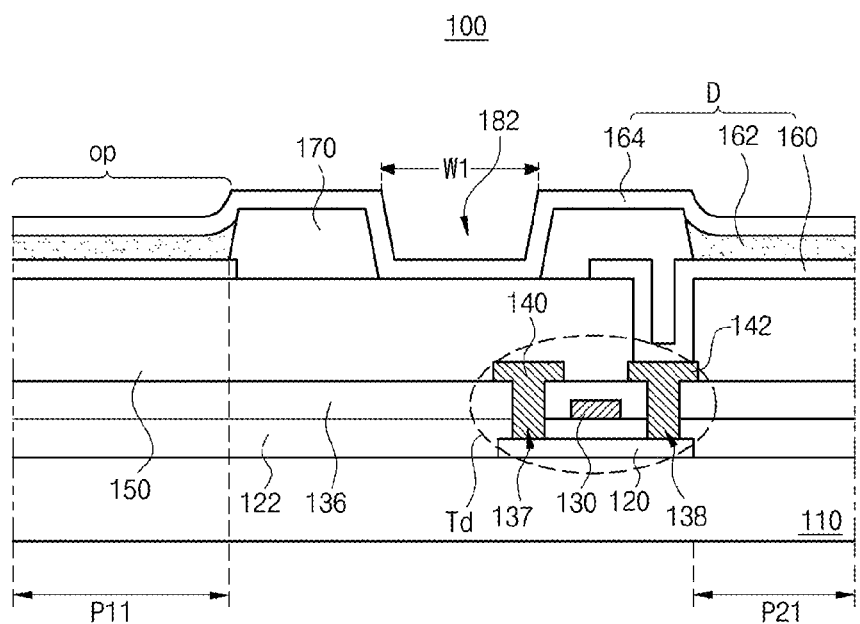
FIG. 4 is a cross-sectional view taken along the line IV-IV of FIG. 3, according to an aspect of the present disclosure.
Figure 5:
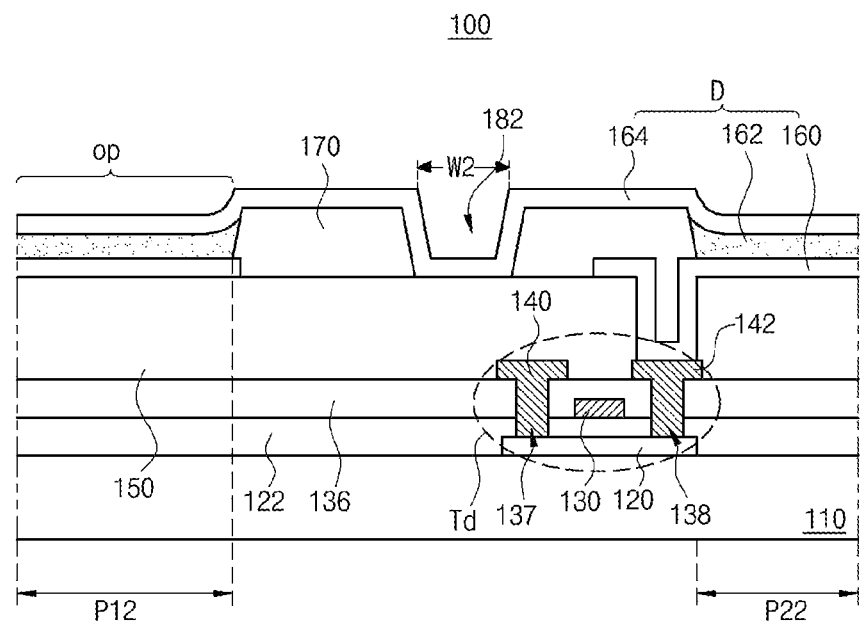
FIG. 5 is a cross-sectional view taken along the line V-V of FIG. 3, according to an aspect of the present disclosure.
Figure 6:
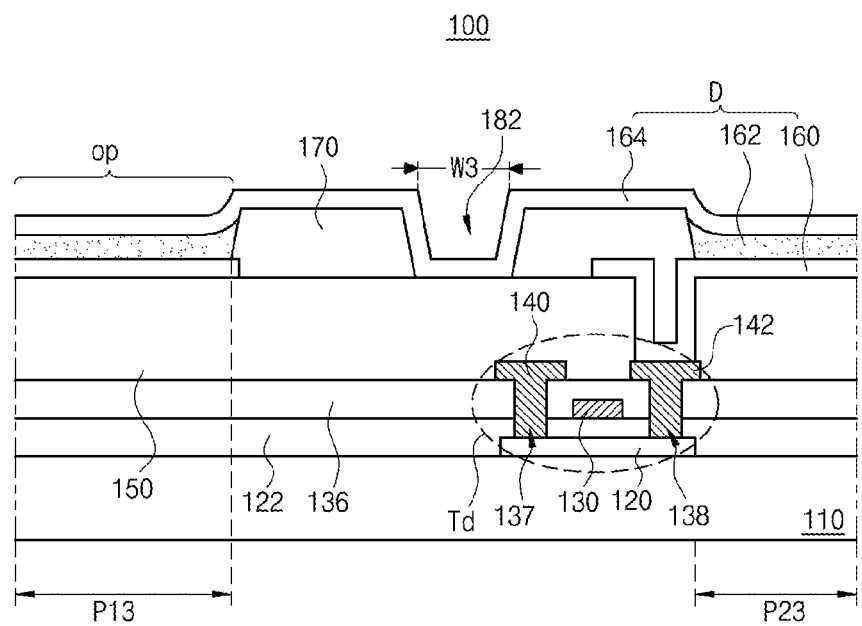
FIG. 6 is a cross-sectional view taken along the line VI-VI of FIG. 3, according to an aspect of the present disclosure.
Figure 7:
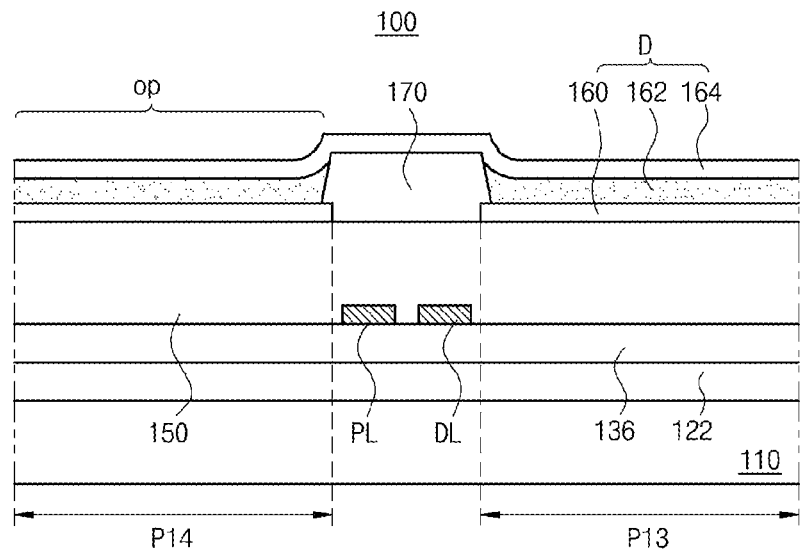
FIG. 7 is a cross-sectional view taken along the line VII-VII of FIG. 3, according to an aspect of the present disclosure.

FIG. 4 is a cross-sectional view taken along the line IV-IV of FIG. 3, according to an aspect of the present disclosure. FIG. 5 is a cross-sectional view taken along the line V-V of FIG. 3, according to an aspect of the present disclosure. FIG. 6 is a cross-sectional view taken along the line VI-VI of FIG. 3, according to an aspect of the present disclosure. FIG. 7 is a cross-sectional view taken along the line VII-VII of FIG. 3, according to an aspect of the present disclosure.

Referring to FIGS. 4 to 7 with FIG. 3, the EL display device 100 includes the substrate 110, where the first pixel row and the second pixel row, the driving TFT Td over the substrate 110, the light emitting diode D connected to the driving TFT Td and the first groove 182 between the first and second pixel rows are defined. The third pixel row may be further defined on the substrate 110, and the EL display device 100 may further include the second groove between the second and third pixel rows. The first pixel row includes the pixels P11, P12, P13 and P14 arranged along the first direction, and the second pixel row is spaced apart from the first pixel row along the second direction and includes the pixels P21, P22 and P23 arranged along the first direction. The third pixel row is spaced apart from the second pixel row along the second direction and includes the pixels P31, P32 and P33 arranged along the first direction.

On the substrate 110, the gate line GL (of FIG. 2) and the data line DL (of FIG. 2), which respectively extend along the first and second directions X and Y, the switching TFT Ts (of FIG. 2), which is connected to the gate line GL and the data line DL, the power line PL (of FIG. 2), which is parallel to and spaced apart from the data line DL, may be formed. The power line PL may be parallel to and spaced apart from the gate line GL.

The gate and data lines GL and DL cross each other to define the pixels P, and the driving TFT Td is connected to the switching TFT Ts. In addition, the storage capacitor Cst (of FIG. 2) may be further formed in each pixel P.

A semiconductor layer 120 is formed on the substrate 110. The substrate 110 may be a glass substrate or a flexible plastic substrate. The semiconductor layer 120 may include an oxide semiconductor material or polycrystalline silicon.

When the semiconductor layer 120 includes the oxide semiconductor material, a light-shielding pattern (not shown) may be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities may be doped into both sides of the semiconductor layer 120.

A gate insulating layer 122 is formed on the semiconductor layer 120 and over an entire surface of the substrate 110. The gate insulating layer 122 may be formed of an inorganic insulating material such as silicon oxide or silicon nitride.

A gate electrode 130, which is formed of a conductive material, e.g., metal, is formed on the gate insulating layer 122 to correspond to a center of the semiconductor layer 120. In addition, the gate line GL and a first capacitor electrode (not shown) are formed on the gate insulating layer 122. The gate line GL extends along the first direction X, and the first capacitor electrode may be connected to the gate electrode 130.

In FIGS. 4 to 7, the gate insulating layer 122 is formed on an entire surface of the first substrate 110. Alternatively, the gate insulating layer 122 may be patterned to have the same shape as the gate electrode 130.

An interlayer insulating layer 136, which is formed of an insulating material, is formed on the gate electrode 130. The interlayer insulating layer 136 may be formed of an inorganic insulating material, e.g., silicon oxide or silicon nitride, or an organic insulating material, e.g., benzocyclobutene or photo-acryl.

The interlayer insulating layer 136 includes first and second contact holes 137 and 138 exposing both sides of the semiconductor layer 120. The first and second contact holes 137 and 138 are positioned at both sides of the gate electrode 130 to be spaced apart from the gate electrode 130.

In FIG. 4, the first and second contact holes 137 and 138 are formed through the gate insulating layer 122. Alternatively, when the gate insulating layer 122 is patterned to have the same shape as the gate electrode 130, the first and second contact holes 137 and 138 is formed only through the interlayer insulating layer 136.

A source electrode 140 and a drain electrode 142, which are formed of a conductive material, e.g., metal, are formed on the interlayer insulating layer 136. In addition, the data line DL along the second direction Y, the power line PL and a second capacitor electrode (not shown) are formed on the interlayer insulating layer 136.

The source electrode 140 and the drain electrode 142 are spaced apart from each other with respect to the gate electrode 130 and respectively contact both sides of the semiconductor layer 120 through the first and second contact holes 137 and 138. The data line DL crosses the gate line GL to define the pixels P. The power line PL is spaced apart from the data line DL. Alternatively, the power line PL may be formed at the same layer as the gate line GL to be parallel to and spaced apart from the gate line GL such that the power line PL and the data line DL may cross each other.

The second capacitor electrode may be connected to the source electrode 140 and overlap the first capacitor electrode. As a result, the first and second capacitor electrodes and the interlayer insulating layer 136 as a dielectric layer therebetween constitute the storage capacitor Cst.

The semiconductor layer 120, the gate electrode 130, the source electrode 140 and the drain electrode 142 constitute the driving TFT Td. In the driving TFT Td, the gate electrode 130, the source electrode 140, and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the driving TFT Td may have an inverted staggered structure. In this instance, the semiconductor layer may include amorphous silicon.

As mentioned above, the switching TFT Ts may be further formed in the substrate 110. The switching TFT Ts may have a structure being substantially same as the driving TFT Td.

The gate electrode 130 of the driving TFT Td may be connected to a drain electrode of the switching TFT Ts, and the source electrode 140 of the driving TFT Td may be connected to the power line PL. A gate electrode and a source electrode of the switching TFT Ts may be connected to the gate line GL and the data line DL, respectively.

A passivation layer 150 including a drain contact hole 152, which exposes the drain electrode 142 of the driving TFT Td, is formed to cover the driving TFT Td.

A first electrode 160 is formed on the passivation layer 150 and is connected to the drain electrode 142 of the driving TFT Td through the drain contact hole 152. The first electrode 160 is separated in each pixel P. The first electrode 160 may be formed of a conductive material having a relatively high work function to serve as an anode. For example, the first electrode 160 may be formed of a transparent conductive material such as indium-tin-oxide (ITO) or indium-zinc-oxide (IZO).

When the EL display device 100 is operated in a top-emission type, a reflection electrode or a reflection layer may be formed under the first electrode 160. For example, the reflection electrode or the reflection layer may be formed of silver (Ag) or aluminum-palladium-copper (APC) alloy.

A bank layer 170 covering an edge of the first electrode 160 is formed on the passivation layer 150. Namely, the bank layer 170 surrounds each pixel P and has an opening OP corresponding to each pixel P. In addition, the bank layer 170 includes the first groove 182 between the first and second pixel rows and the second groove 184 between the second and third pixel rows.

The bank layer 170 has a flat top surface at a space between the first and third pixels P11 and P13 and in a space between the second and third pixels P12 and P13 in the first pixel row without a groove. Namely, the bank layer 170 between adjacent pixels P along the first direction X, e.g., at a space between the third and fourth pixels P13 and P14 in the first pixel row, has a flat top surface, and the bank layer 170 between adjacent pixels P along the second direction Y has a concave top surface.

The center of the first electrode 160 is exposed through the opening OP of the bank layer 170 and the passivation layer 150 is exposed through the grooves 182 and 184 of the bank layer 170. Namely, a depth of each of the grooves 182 and 184 is substantially equal to a thickness of the bank layer 170. Alternatively, the grooves 182 and 184 may be formed by partially removing the bank layer 170 such that the depth of each of the grooves 182 and 184 may be smaller than the thickness of the bank layer 170. In addition, the grooves 182 and 184 may be formed by completely removing the bank layer 170 and completely or partially removing the passivation layer 150 such that the depth of each of the grooves 182 and 184 may be greater than the thickness of the bank layer 170.

The first groove 182 between the first and second pixel rows has the first width w1 along the second direction Y corresponding to the first pixel P11 positioned at one end of the first pixel row, the second width w2, which is smaller than the first width w1, along the second direction Y corresponding to the second pixel P12 positioned at the other end of the first pixel row and the third width w3, which is smaller than the first width w1 and greater than the second width w2, along the second direction Y corresponding to the third pixel P13 positioned between the first and second pixels P11 and P12.

In other words, each of the first and second grooves 182 and 184 may include a first portion having the first width w1 along the second direction Y corresponding to one end of each pixel row, a second portion having the second width w2 along the second direction Y corresponding to the other end of each pixel row and a third portion having the third width w3, which is smaller than the first width w1 and greater than the second width w2, along the second direction Y in a space between the first and second portions. As a result, in each of the first and second grooves 182 and 184, the plane view area (surface area) of the third portion is smaller than that of the first portion and greater than that of the second portion.

The width of each of the first and second grooves 182 and 184 is gradually decreased from one end of each pixel row to the other end of each pixel row. Alternatively, each of the first and second grooves 182 and 184 may have a first width corresponding to a first pixel group at one side of each pixel row, a second width corresponding to a second pixel group at the other side of each pixel row and a third width, which is smaller than the first width and greater than the second width, corresponding to a third pixel group between the first and second pixel groups.

The emitting layer 162 is formed on the first electrode 160. The emitting layer 162 is formed by the solution process using a liquid phase emitting material. Namely, the emitting layer 162 is formed by coating an emitting material dissolved in a solvent and drying the solvent. For example, the solution process may be an inkjet coating process, a slit coating process, a spin coating process, a printing process or a drop coating process, but it is not limited thereto.

The bank layer 170 has an inclined side surface, and the emitting layer 162 is formed along the inclined surface of the bank layer 170 such that a side of the emitting layer 162 is formed to be inclined. In addition, since the emitting layer 162 is formed by the solution process, an edge of the emitting layer 162 may have a thickness being greater than a center of the emitting layer 162 by a coffee-ring effect in the drying process.

The emitting 162 may have a single-layered structure of an emitting material layer (EML) including the emitting material. To improve an emitting efficiency of the emitting diode D, the emitting layer 162 may have a multi-layered structure of an hole injection layer (HIL), a hole transporting layer (HTL), the EML, an electron transporting layer (EIL) and an electron injection layer (EIL). The HIL and the HTL may be sequentially stacked between the first electrode 160 and the EML, and the ETL and the EIL may be sequentially stacked on the EML.

The EML may include at least one of an organic emitting material, such as a phosphorescent compound (phosphorescent emitting material) or a fluorescent compound (fluorescent emitting material), and an inorganic emitting material, such as a quantum dot. Namely, the EL display device 100 may be an organic light emitting display (OLED) device or a quantum dot light emitting display (QLED) device.

The solvent in the emitting material solution is coated in the grooves 182 and 184 and is dried to be evaporated. Accordingly, after the emitting layer 162 is formed, there is no layer in the grooves 182 and 184 such that the passivation layer 150 is exposed through the grooves 182 and 184.

Alternatively, when the emitting material solution is coated in the grooves 182 and 184, an auxiliary material pattern (not shown) may be formed in the grooves 182 and 184.

The inkjet head (not shown) is scanned from one end (a left side end in FIG. 3) to the other end (a right side end in FIG. 3) to coat the emitting material solution. For example, the coating of the emitting material solution is started at the first pixel P11 and a portion of the first groove 182 corresponding to the first pixel P11 and is finished at the second pixel P12 and a portion of the first groove 182 corresponding to the second pixel P12. After the coating process is finished, the substrate 110 is transferred into the vacuum dry chamber.

The first pixel P11 is present in the natural dry for a longer period than the second and third pixels P12 and P13. However, since the first portion of the first groove 182 has a width being greater than each of the second and third portions of the first groove 182, the evaporation rate of the solvent in the first portion is faster than the evaporation rate of the solvent in each of the second and third portions. Accordingly, the saturation rate of the solvent in a region adjacent to the first pixel P11 is faster than the saturation rate of the solvent in a region adjacent to each of the second and third pixels P12 and P13.

In other words, although the emitting material solution in the first to third pixels P11 to P13 is present in air for different periods, the emitting material solution in the first to third pixels P11 to P13 has the same natural dry period because there is a difference of the saturation rate of the solvent. Accordingly, the thickness non-uniformity problem of the emitting layer 162 according to a direction of the coating process is prevented or minimized.

The second electrode 164 is formed on the passivation layer 150 in the first and second grooves 182 and 184, the emitting layer 162 in each pixel P and the bank layer 170.

The second electrode 164 may be formed of a conductive material having a relatively low work function to serve as a cathode. For example, the second electrode 164 may be formed of aluminum (Al), magnesium (Mg), Al—Mg alloy, Al-silver alloy.

When the EL display device 100 is operated in a top-emission type, the second electrode 164 has a thin profile to have a semi-transparent property. On the other hand, when the EL display device 100 is operated in a bottom-emission type, the second electrode 164 may serve as a reflection electrode.

The second electrode 164 in each pixel P contacts the emitting layer 162, and the second electrode 164 in the first and second grooves 182 and 184 contacts the passivation layer 150. In addition, the second electrode 164 between adjacent pixels P in each pixel row contacts the bank layer 170.

In other words, from the substrate 110, the second electrode 164 has a first height in each pixel P, a second height, which is smaller than the first height, in each of the first and second grooves 182 and 184 and a third height, which is greater than the first height, in a space between adjacent pixels P in each pixel row.

When the auxiliary material pattern (not shown) is formed in the first and second grooves 182 and 184, the second electrode 164 in the first and second grooves 182 and 184 contacts the auxiliary material pattern and has a fourth height being substantially same as the first height. Since the auxiliary material pattern dost not contact the first electrode 160, there is no emission from the auxiliary material pattern in the first and second grooves 182 and 184.

The first electrode 160, the second electrode 164 facing the first electrode 160 and the emitting layer 162 between the first and second electrodes 160 and 164 constitute the light emitting diode D.

Although not shown, an encapsulation substrate or an encapsulation film may be formed on or over the light emitting diode D to prevent penetration of moisture into the light emitting diode D. The encapsulation film having a triple-layered structure of a first inorganic layer, an organic layer and a second inorganic layer may be formed to cover the light emitting diode.

In addition, a polarization plate may be disposed on the encapsulation film to reduce an ambient light reflection. The polarization plate may be a circular polarization film.

In the EL display device 100 of the present disclosure, since the emitting layer 162 is formed by the solution process, the fabricating process of the EL display device 100 is simplified and the EL display device 100 can be used for the large size display device.

In addition, since the solvent or the emitting material solution is coated in the grooves 182 and 184, each of which is formed between pixel rows and has a difference in the plane view area (surface area) along the scanning direction in the solution process, the thickness non-uniformity problem of the emitting layer 162 caused by the scanning direction is prevented or minimized. Accordingly, the problems in the display quality and the lifespan of the EL display device 100 resulting from the thickness non-uniformity problem of the emitting layer 162 are prevented.

Figure 8:
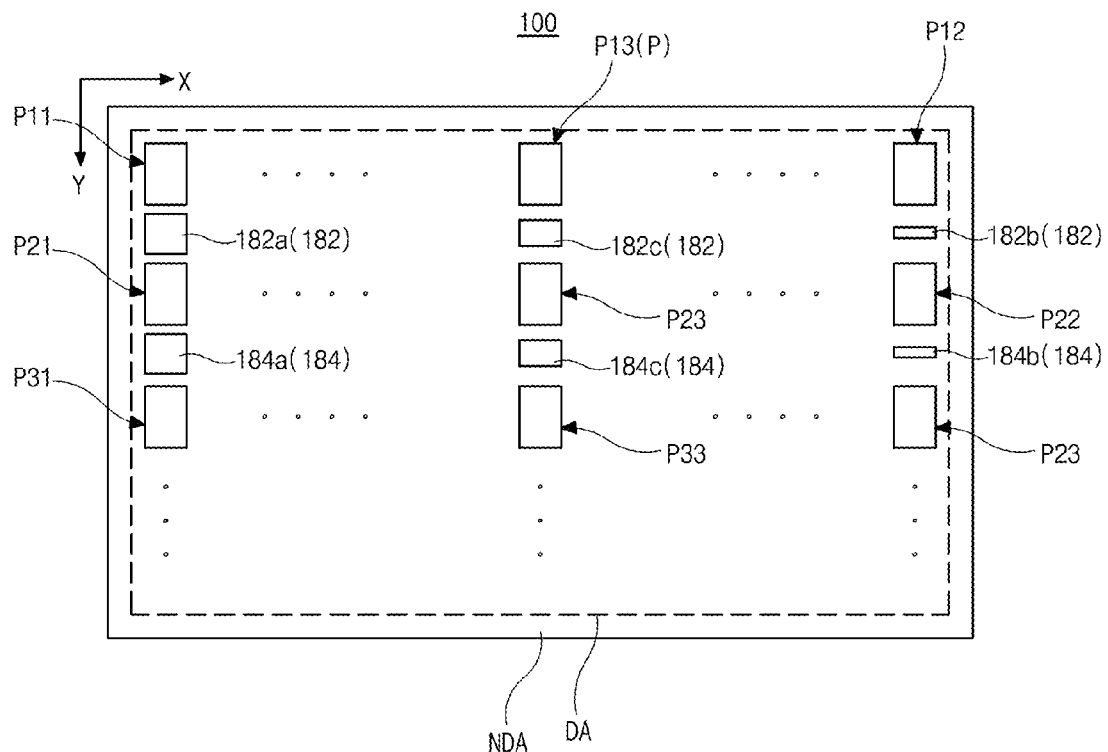
FIG. 8 is a schematic cross-sectional view of an EL display device, according to an aspect of the present disclosure.

FIG. 8 is a schematic cross-sectional view of an EL display device, according to an aspect of the present disclosure.

As shown in FIG. 8, the EL display device 100 according to one embodiment of the present disclosure includes a substrate (not shown) where a display area DA and a non-display area NDA at a periphery of the display area DA are defined. In the display area DA of the substrate, a plurality of pixels P11, P12, P13 and P14 are arranged in a first pixel row along a first direction X, and a plurality of pixels P21, P22 and P23 are arrange in a second pixel row along the first direction X. A plurality of pixels P31, P32 and P33 are arranged in a third pixel row along the first direction X. In addition, a first groove (or indent) 182 is disposed between the first pixel row and the second pixel row, and a second groove (or indent) 184 is disposed between the second pixel row and the third pixel row.

The first groove 182 includes first, second and third groove patterns 182a, 182b and 182c respectively corresponding to the first, second and third pixels P11, P12 and P13 in the first pixel row, and the second groove 184 includes first, second and third groove patterns 184a, 184b and 184c respectively corresponding to the first, second and third pixels P21, P22 and P23 in the second pixel row.

Namely, in the EL display device 100 of the second embodiment, the first groove 182 includes a plurality of groove patterns 182a, 182b and 182c having an island shape and being spaced apart from each other, and the second groove 184 includes a plurality of groove patterns 184a, 184b and 184c having an island shape and being spaced apart from each other.

In the first and second grooves 182 and 184, the plane view area (surface area) of each of the third groove patterns 182c and 184c is smaller than that of each of the first groove patterns 182a and 184a and greater than that of each of the second groove patterns 182b and 184b. Namely, in the second direction Y, each of the third groove patterns 182c and 184c has a width being smaller than each of the first groove patterns 182a and 184a and greater than each of the second groove patterns 182b and 184b.

Alternatively, each of the third groove patterns 182c and 184c may have the same width in the second direction Y as teach of the first groove patterns 182a and 184a and each of the second groove patterns 182b and 184b and may have a length in the first direction X being smaller than each of the first groove patterns 182a and 184a and greater than each of the second groove patterns 182b and 184b.

In the first groove 182, the width may be gradually decreased from the first groove pattern 182a toward the second groove pattern 182b. Alternatively, in the first groove 182, the first groove pattern 182a may correspond to a first pixel group at one side of the first pixel row, and the second groove pattern 182b may correspond to a second pixel group at the other side of the first pixel row. In addition, the third groove pattern 182c may correspond to a third pixel group between the first and second pixel groups.

Figure 9:
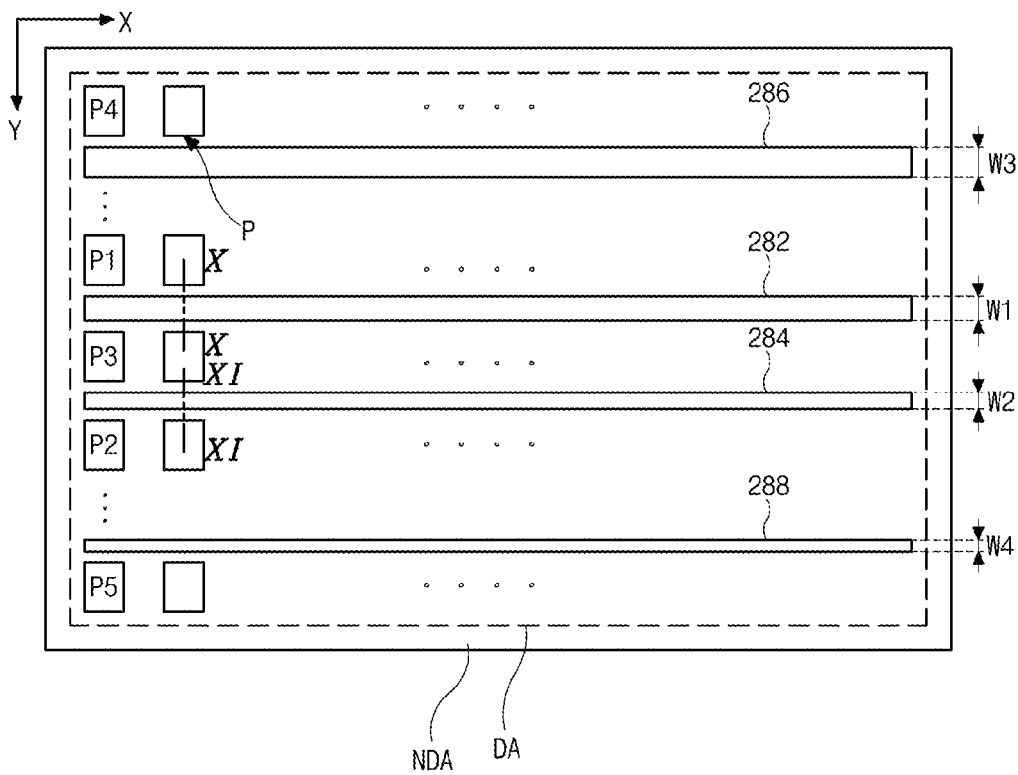
FIG. 9 is a schematic plane view of an EL display device, according to an aspect of the present disclosure.

FIG. 9 is a schematic plane view of an EL display device according to an aspect of the present disclosure.

As shown in FIG. 9, the EL display device 200 according to the third embodiment of the present disclosure includes a substrate (not shown) where a display area DA and a non-display area NDA at a periphery of the display area DA are defined. In the display area DA of the substrate, a first pixel row, where a plurality of first pixel P1 are arranged in a first direction X, a second pixel row, where a plurality of second pixel P2 are arranged in the first direction X, and a third pixel row, where a plurality of third pixel P3 are arranged in the first direction X, are defined. The second pixel row is positioned at a side of the first pixel row, and the third pixel row is positioned between the first and second pixel rows. A first groove 282 is disposed between the first and third pixel rows, and a second groove 284 is disposed between the second and third pixel rows. A length of the first groove 282 may be substantially equal to that of the first pixel row, and a length of the second groove 284 may be substantially equal to that of the second pixel row.

Although not shown, a light emitting diode, which includes first and second electrodes facing each other and an emitting layer therebetween, is formed in each pixel P.

The emitting layer is formed by a solution process using a liquid phase emitting material. Namely, the emitting layer is formed by coating an emitting material dissolved in a solvent and drying the solvent. For example, the solution process may be an inkjet coating process, a slit coating process, a spin coating process, a printing process or a drop coating process, but it is not limited thereto.

For example, an inkjet head (not shown) moves along the second direction Y to coat the emitting material solution in each pixel P. In the first pixel row, the coating process is performed from an end of first pixel row toward the second pixel row.

The first groove 282 has a plane area (surface area) greater than the second groove 284. Namely, the first groove 282 has a first width w1 along the second direction Y, and the second groove 284 has a second width w2, which is smaller than the first width, along the second direction Y. In this instance, the first groove 282 may have a uniform width corresponding to the first pixel row, and second groove 284 may have a uniform width corresponding to the second pixel row.

In FIG. 9, each of the first and second grooves 282 and 284 has a single body corresponding to each of the first and second pixel rows. Alternatively, each of the first and second grooves 282 and 284 may include a plurality of groove patterns corresponding to each pixel P.

In addition, in FIG. 9, the plane view area (surface area) of the groove is gradually decreased along the scanning direction, i.e., the second direction Y. Alternatively, the plane view area of the groove may be step-wisely decreased according to a pixel row group including at least two pixel rows.

When the emitting layer of the light emitting diode is formed by the solution process (coating process) using the liquid phase emitting material solution, the liquid phase emitting material solution or the solvent in the liquid phase emitting material solution may coated in the first and second grooves 282 and 284.

Since the first and second grooves 282 and 284, which is arranged along the second direction Y as the scanning direction, have a plane view area deviation, the solvent evaporation rate is different along the second direction Y. Namely, the solvent evaporation has a first rate in the first groove 282 and a second rate, which is smaller than the first rate, in the second groove 284.

Accordingly, the solvent saturation rate in a region corresponding to the first pixel row is increased in comparison to the solvent saturation rate in a region corresponding to the second pixel row.

In addition, in the display area DA of the substrate, a fourth pixel row, which is disposed at the other side of the first pixel row and includes a plurality of fourth pixels P4 arranged along the first direction X, and a fifth pixel row, which is spaced apart from the second pixel row along the second direction Y and includes a plurality of fifth pixels P5 arranged along the first direction X, may be further defined. In this instance, a third groove 286 is disposed between the first and fourth pixel rows, and a fourth groove 288 is disposed between the second and fifth pixel rows.

The plane view area of the third groove 286 is greater than that of the first groove 282, and the plane view area of the fourth groove 288 is smaller than that of the second groove 284. Namely, the third groove 286 has a third width w3 greater than the first width w1, and the fourth groove 288 has a fourth width w4 smaller than the second width w2.

Accordingly, the solvent evaporation has a third rate, which is greater than the first rate, in the third groove 286 such that the solvent saturation rate in a region corresponding to the fourth pixel row is increased in comparison to the solvent saturation rate in a region corresponding to the first pixel row. In addition, the solvent evaporation has a fourth rate, which is smaller than the second rate, in the fourth groove 288 such that the solvent saturation rate in a region corresponding to the fifth pixel row is decreased in comparison to the solvent saturation rate in a region corresponding to the second pixel row.

Accordingly, the thickness non-uniformity problem of the emitting layer resulting from the scanning direction in the solution process is prevented.

Figure 10:
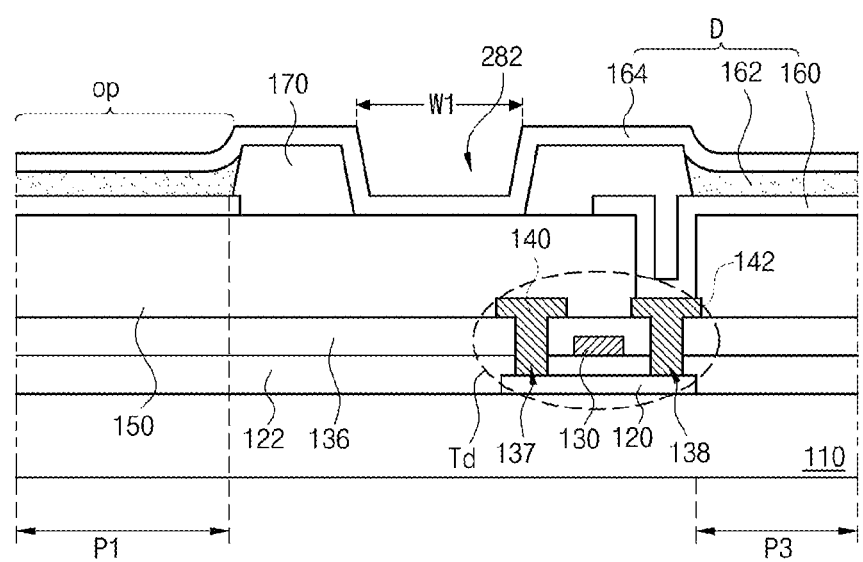
FIG. 10 is a cross-sectional view taken along the line X-X of FIG. 9, according to an aspect of the present disclosure.
Figure 11:
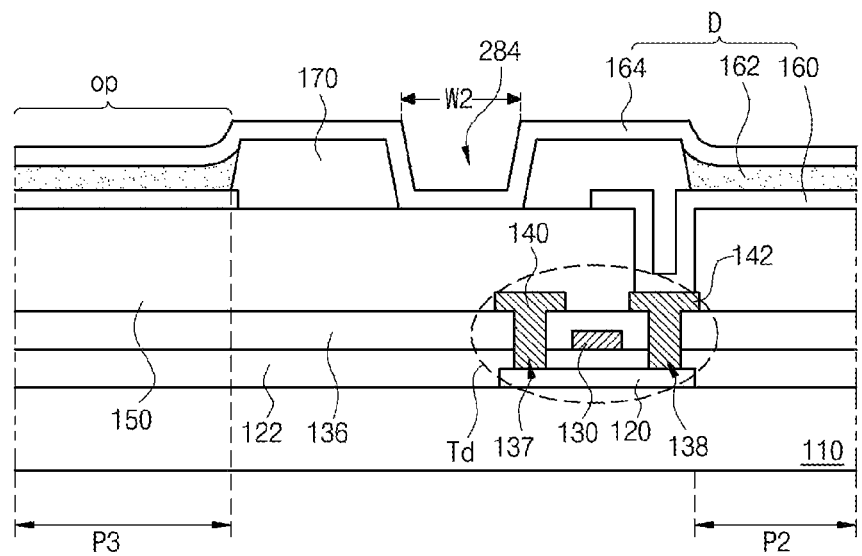
FIG. 11 is a cross-sectional view taken along the line XI-XI of FIG. 9, according to an aspect of the present disclosure.

FIG. 10 is a cross-sectional view taken along the line X-X of FIG. 9, according to an aspect of the present disclosure. FIG. 11 is a cross-sectional view taken along the line XI-XI of FIG. 9, according to an aspect of the present disclosure.

Referring to FIGS. 10 and 11 with FIG. 9, the EL display device 200 includes the substrate 210, where the first to third pixel rows are defined, the driving TFT Td over the substrate 210, the light emitting diode D connected to the driving TFT Td, the first groove 282 between the first and third pixel rows and the second groove 284 between the second and third pixel rows. The first pixel row includes the first pixels P1 arranged along the first direction X, and the second pixel row, which is spaced apart from the first pixel row along the second direction Y, includes the second pixels P2 arranged along the first direction X. The third pixel row, which is positioned between the first and second pixel rows, includes the third pixels P3 arranged along the first direction X.

The semiconductor layer 220 is formed on the substrate 210, and the gate insulating layer 222 is formed on the semiconductor layer 220. The substrate 210 may be a glass substrate or a flexible plastic substrate.

The gate electrode 230 corresponding to a center of the semiconductor layer 220 is formed on the gate insulating layer 222, and the interlayer insulating layer 236 is formed on the gate electrode 230. The interlayer insulating layer 236 includes the first and second contact holes 237 and 238 exposing both sides of the semiconductor layer 220.

The source electrode 240 and the drain electrode 242, which are formed of a conductive material, e.g., metal, are formed on the interlayer insulating layer 236. The source electrode 240 and the drain electrode 242 are spaced apart from each other with respect to the gate electrode 230 and respectively contact both sides of the semiconductor layer 220 through the first and second contact holes 237 and 238. In addition, the data line DL and the power line PL along the second direction Y are formed on the interlayer insulating layer 236.

The semiconductor layer 220, the gate electrode 230, the source electrode 240 and the drain electrode 242 constitute the driving TFT Td.

The passivation layer 250 including the drain contact hole 252, which exposes the drain electrode 242 of the driving TFT Td, is formed to cover the driving TFT Td, and the first electrode 260, which is connected to the drain electrode 242 of the driving TFT Td through the drain contact hole 252, is formed on the passivation layer 250. The first electrode 260 may be formed of a conductive material having a relatively high work function to serve as an anode.

The bank layer 270 covering an edge of the first electrode 260 is formed on the passivation layer 250. Namely, the bank layer 270 has the opening OP corresponding to each pixel P. In addition, the bank layer 270 includes the first groove 282 between the first and third pixel rows and the second groove 284 between the second and third grooves.

The bank layer 270 has a flat top surface at a space between adjacent pixels P in each pixel row without a groove. For example, the bank layer 270 between the first pixels P1 in the first pixel row has the flat top surface. Namely, the bank layer 270 between adjacent pixels P along the first direction X has a flat top surface, and the bank layer 270 between adjacent pixels P along the second direction Y has a concave top surface.

The center of the first electrode 260 is exposed through the opening OP of the bank layer 270, and the passivation layer 250 is exposed through the grooves 282 and 284 of the bank layer 270. Namely, a depth of each of the grooves 282 and 284 is substantially equal to a thickness of the bank layer 270. Alternatively, the grooves 282 and 284 may be formed by partially removing the bank layer 270 such that the depth of each of the grooves 282 and 284 may be smaller than the thickness of the bank layer 270. In addition, the grooves 282 and 284 may be formed by completely removing the bank layer 270 and completely or partially removing the passivation layer 250 such that the depth of each of the grooves 282 and 284 may be greater than the thickness of the bank layer 270.

The first groove 282 between the first and third pixel rows has the first width w1 along the second direction Y, and the second groove 284 between the second and third pixel rows has the second width w2, which is smaller than the first width w1, along the second direction Y. As a result, the first groove 282 has the plane view area (surface area) being greater than the second groove 284.

The emitting layer 262 is formed on the first electrode 260. The emitting layer 262 is formed by the solution process using a liquid phase emitting material. Namely, the emitting layer 262 is formed by coating an emitting material dissolved in a solvent and drying the solvent. For example, the solution process may be an inkjet coating process, a slit coating process, a spin coating process, a printing process or a drop coating process, but it is not limited thereto.

The emitting 262 may have a single-layered structure of an emitting material layer (EML) including the emitting material. To improve an emitting efficiency of the emitting diode D, the emitting layer 262 may have a multi-layered structure of an hole injection layer (HIL), a hole transporting layer (HTL), the EML, an electron transporting layer (EIL) and an electron injection layer (EIL). The HIL and the HTL may be sequentially stacked between the first electrode 260 and the EML, and the ETL and the EIL may be sequentially stacked on the EML.

The EML may include at least one of an organic emitting material, such as a phosphorescent compound (phosphorescent emitting material) or a fluorescent compound (fluorescent emitting material), and an inorganic emitting material, such as a quantum dot. Namely, the EL display device 200 may be an organic light emitting display (OLED) device or a quantum dot light emitting display (QLED) device.

The solvent in the emitting material solution is coated in the grooves 282 and 284 and is dried to be evaporated. Accordingly, after the emitting layer 262 is formed, there is no layer in the grooves 282 and 284 such that the passivation layer 250 is exposed through the grooves 282 and 284.

Alternatively, when the emitting material solution is coated in the grooves 282 and 284, an auxiliary material pattern (not shown) may be formed in the grooves 282 and 284.

The inkjet head (not shown) is scanned from one end (a upper side end in FIG. 9) to the other end (a lower side end in FIG. 9) to coat the emitting material solution. For example, the coating of the emitting material solution is started at the fourth pixel row and is finished at the fifth pixel row. After the coating process is finished, the substrate 210 is transferred into the vacuum dry chamber.

The first pixel row is present in the natural dry for a longer period than the second and third pixel rows. However, since the first groove 282 has a width being greater than the second groove 284, the evaporation rate of the solvent in the first groove 282 is faster than the evaporation rate of the solvent in the second groove 284. Accordingly, the saturation rate of the solvent in a region adjacent to the first pixel row is faster than the saturation rate of the solvent in a region adjacent to the second pixel row.

In other words, although the emitting material solution in the first to third pixel rows is present in air for different periods, the emitting material solution in the first to third pixel rows has the same natural dry period because there is a difference of the saturation rate of the solvent. Accordingly, the thickness non-uniformity problem of the emitting layer 262 according to a direction of the coating process is prevented or minimized.

The second electrode 264 is formed on the passivation layer 250 in the first and second grooves 282 and 284, the emitting layer 262 in each pixel P and the bank layer 270. The second electrode 264 may be formed of a conductive material having a relatively low work function to serve as a cathode.

The second electrode 264 in each pixel P contacts the emitting layer 262, and the second electrode 264 in the first and second grooves 282 and 284 contacts the passivation layer 250. In addition, the second electrode 264 between adjacent pixels P in each pixel row contacts the bank layer 270.

In other words, from the substrate 210, the second electrode 264 has a first height in each pixel P, a second height, which is smaller than the first height, in each of the first and second grooves 282 and 284 and a third height, which is greater than the first height, in a space between adjacent pixels P in each pixel row.

When the auxiliary material pattern (not shown) is formed in the first and second grooves 282 and 284, the second electrode 264 in the first and second grooves 282 and 284 contacts the auxiliary material pattern and has a fourth height being substantially same as the first height. Since the auxiliary material pattern dost not contact the first electrode 260, there is no emission from the auxiliary material pattern in the first and second grooves 282 and 284.

The first electrode 260, the second electrode 264 facing the first electrode 260 and the emitting layer 262 between the first and second electrodes 260 and 264 constitute the light emitting diode D.

Although not shown, an encapsulation substrate or an encapsulation film may be formed on or over the light emitting diode D to prevent penetration of moisture into the light emitting diode D. In addition, a polarization plate may be disposed on the encapsulation film to reduce an ambient light reflection. The polarization plate may be a circular polarization film.

In the EL display device 200 of the present disclosure, since the emitting layer 262 is formed by the solution process, the fabricating process of the EL display device 200 is simplified and the EL display device 200 is adequate to the large size display device.

In addition, since the solvent or the emitting material solution is coated in the grooves 282 and 284, each of which is formed between pixel rows and has a difference in the plane view area (surface area) along the scanning direction in the solution process, the thickness non-uniformity problem of the emitting layer 262 caused by the scanning direction is prevented or minimized. Accordingly, the problems in the display quality and the lifespan of the EL display device 200 resulting from the thickness non-uniformity problem of the emitting layer 262 are prevented.

Figure 12:
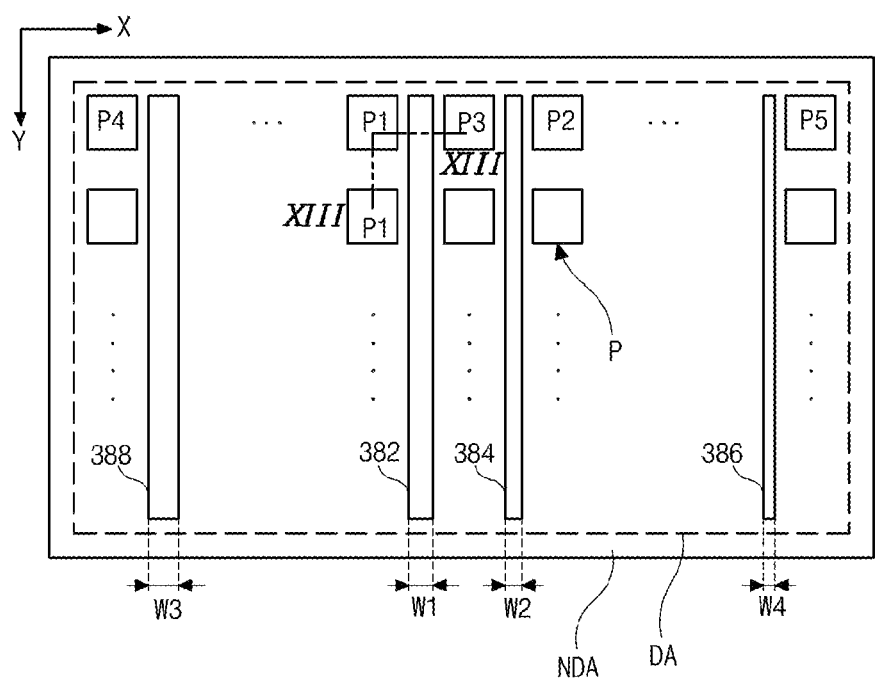
FIG. 12 is a schematic plane view of an EL display device, according to an aspect of the present disclosure.
Figure 13:
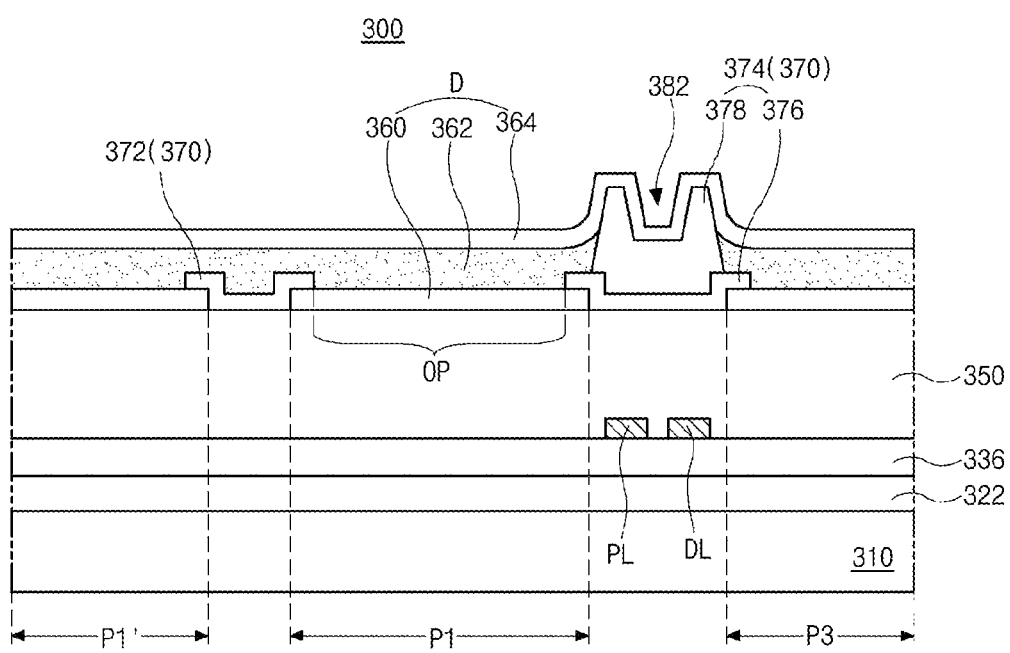
FIG. 13 is a cross-sectional view taken along the line XIII-XIII of FIG. 12, according to an aspect of the present disclosure.

FIG. 12 is a schematic plane view of an EL display device according to an aspect of the present disclosure. FIG. 13 is a cross-sectional view taken along the line XIII-XIII of FIG. 12, according to an aspect of the present disclosure.

As shown in FIGS. 12 and 13, the EL display device 300 according to one example embodiment of the present disclosure includes a substrate 310 where a display area DA and a non-display area NDA at a periphery of the display area DA are defined. In the display area DA of the substrate 310, a first pixel row, where a plurality of first pixel P1 are arranged in a second direction Y, a second pixel row, where a plurality of second pixel P2 are arranged in the second direction Y, and a third pixel row, where a plurality of third pixel P3 are arranged in the second direction Y, are defined. The second pixel row is positioned at a side of the first pixel row, and the third pixel row is positioned between the first and second pixel rows.

The driving TFT Td in each pixel P, the light emitting diode D connected to the driving TFT Td, a first groove 382 between the first and third pixel rows and the second groove 384 between the second and third pixel rows are formed on the substrate 310.

As explained with FIG. 3, the driving TFT Td includes the semiconductor layer, the gate electrode, the source electrode and the drain electrode.

The gate insulating layer 322 and the interlayer insulating layer 336 are sequentially stacked on the substrate 310, and the data line DL and the power line PL are formed on the interlayer insulating layer 336. The passivation layer 350 is formed to cover the data line DL and the power line PL.

The first electrode 360, which is connected to the drain electrode 342 of the driving TFT Td, is formed on the passivation layer 350. The first electrode 360 may be formed of a conductive material having a relatively high work function to serve as an anode.

The bank layer 370 covering an edge of the first electrode 260 is formed on the passivation layer 350. The bank layer 370 has the opening OP corresponding to each pixel P.

The bank layer 370 includes a first bank layer 372 positioned between adjacent pixels P in the pixel row and a second bank layer 374 positioned between adjacent pixel rows. Namely, the first bank layer 372 is positioned between adjacent first pixels P1 and P1' in the first pixel row, and the second bank layer 374 is positioned between the first and third pixels P1 and P3. In one example, the second bank layer 374 is such that the solution material deposited on a given row (in x-direction) of pixels is blocked from leaking to an adjacent row of pixels. Alternatively, the second bank layer 374 is such that the solution material deposited on a given column (in y-direction) of pixels is blocked from leaking to an adjacent column of pixels.

The first bank layer 372 has a thickness smaller than the second bank layer 374. The first bank layer 372 may have a single-layered structure, and the second bank layer 374 may have a double-layered structure of a first layer 376 and a second layer 378 on the first layer 376. The first bank layer 372 may be formed of the same material as the first layer 376 of the second bank layer 374.

The second layer 378 of the second bank layer 374 includes a first groove 382 between the first and third pixel rows and a second groove 384 between the second and third pixel rows.

In FIG. 13, a depth of the first groove 382 is smaller than a thickness of the second layer 378 of the second bank layer 374. Alternatively, the depth of the first groove 382 is substantially equal to or greater than the thickness of the second layer 378 of the second bank layer 374.

The first groove 382 between the first and third pixel rows has the first width w1 along the first direction X, and the second groove 384 between the second and third pixel rows has the second width w2, which is smaller than the first width w1, along the first direction X. As a result, the first groove 382 has the plane view area (surface area) being greater than the second groove 384.

In addition, in the display area DA of the substrate 310, a fourth pixel row, which is disposed at the other side of the first pixel row and includes a plurality of fourth pixels P4 arranged along the second direction Y, and a fifth pixel row, which is spaced apart from the second pixel row along the first direction X and includes a plurality of fifth pixels P5 arranged along the second direction Y, may be further defined. In this instance, a third groove 386 is disposed between the first and fourth pixel rows, and a fourth groove 388 is disposed between the second and fifth pixel rows.

The plane view area of the third groove 386 is greater than that of the first groove 382, and the plane view area of the fourth groove 388 is smaller than that of the second groove 384. Namely, the third groove 386 has a third width w3 greater than the first width w1, and the fourth groove 388 has a fourth width w4 smaller than the second width w2.

The emitting layer 362 is formed on the first electrode 360. The emitting layer 362 is formed by the solution process using a liquid phase emitting material. Namely, the emitting layer 362 is formed by coating an emitting material dissolved in a solvent and drying the solvent. For example, the solution process may be an inkjet coating process, a slit coating process, a spin coating process, a printing process or a drop coating process, but it is not limited thereto.

The emitting 362 may have a single-layered structure of an emitting material layer (EML) including the emitting material. To improve an emitting efficiency of the emitting diode D, the emitting layer 362 may have a multi-layered structure of an hole injection layer (HIL), a hole transporting layer (HTL), the EML, an electron transporting layer (EIL) and an electron injection layer (EIL). The HIL and the HTL may be sequentially stacked between the first electrode 360 and the EML, and the ETL and the EIL may be sequentially stacked on the EML.

The EML may include at least one of an organic emitting material, such as a phosphorescent compound (phosphorescent emitting material) or a fluorescent compound (fluorescent emitting material), and an inorganic emitting material, such as a quantum dot. Namely, the EL display device 300 may be an organic light emitting display (OLED) device or a quantum dot light emitting display (QLED) device.

As mentioned above, since the first bank layer 372, which is positioned between adjacent pixels P in the pixel row, has a relatively small thickness, the emitting layer 362 in the pixels P of each pixel row may be connected to each other (continuous). For example, all of the first pixels P1 in the first pixel row may be one of a red pixel, a green pixel and a blue pixel.

The solvent in the emitting material solution is coated in the grooves 382 and 384 and is dried to be evaporated. Accordingly, after the emitting layer 362 is formed, there is no layer in the grooves 382 and 384 such that a portion of the second layer 378 of the second bank layer 374 is exposed through the grooves 382 and 384.

Alternatively, when the emitting material solution is coated in the grooves 382 and 384, an auxiliary material pattern (not shown) may be formed in the grooves 382 and 384.

The inkjet head (not shown) is scanned from one end (a left side end in FIG. 12) to the other end (a right side end in FIG. 12) to coat the emitting material solution. For example, the coating of the emitting material solution is started at the fourth pixel row and is finished at the fifth pixel row. After the coating process is finished, the substrate 310 is transferred into the vacuum dry chamber.

The first pixel row is present in the natural dry for a longer period than the second and third pixel rows. However, since the first groove 382 has a width being greater than the second groove 384, the evaporation rate of the solvent in the first groove 382 is faster than the evaporation rate of the solvent in the second groove 384. Accordingly, the saturation rate of the solvent in a region adjacent to the first pixel row is faster than the saturation rate of the solvent in a region adjacent to the second pixel row.

In other words, although the emitting material solution in the first to third pixels P1, P2 and P3 of the first to third pixel rows is present in air for different periods, the emitting material solution in the first to third pixel rows has the same natural dry period because there is a difference of the saturation rate of the solvent. Accordingly, the thickness non-uniformity problem of the emitting layer 362 according to a direction of the coating process is prevented or minimized.

The second electrode 364 is formed on the emitting layer 362 in each pixel P and the bank layer 370. The second electrode 364 may be formed of a conductive material having a relatively low work function to serve as a cathode.

The second electrode 364 in each pixel P contacts the emitting layer 362, and the second electrode 364 in the first and second grooves 382 and 384 contacts the second layer 378 of the second bank layer 374. In addition, the second electrode 364 between adjacent pixels P in each pixel row contacts the first bank layer 372.

When the auxiliary material pattern (not shown) is formed in the first and second grooves 382 and 384, the second electrode 364 in the first and second grooves 382 and 384 contacts the auxiliary material pattern. Since the auxiliary material pattern dost not contact the first electrode 360, there is no emission from the auxiliary material pattern in the first and second grooves 382 and 384.

The first electrode 360, the second electrode 364 facing the first electrode 360 and the emitting layer 362 between the first and second electrodes 360 and 364 constitute the light emitting diode D.

Although not shown, an encapsulation substrate or an encapsulation film may be formed on or over the light emitting diode D to prevent penetration of moisture into the light emitting diode D. In addition, a polarization plate may be disposed on the encapsulation film to reduce an ambient light reflection. The polarization plate may be a circular polarization film.

In the EL display device 300 of the present disclosure, since the emitting layer 362 is formed by the solution process, the fabricating process of the EL display device 300 is simplified and the EL display device 300 is adequate to the large size display device.

In addition, since the solvent or the emitting material solution is coated in the grooves 382 and 384, each of which is formed between pixel rows and has a difference in the plane view area (surface area) along the scanning direction in the solution process, the thickness non-uniformity problem of the emitting layer 362 caused by the scanning direction is prevented or minimized. Accordingly, the problems in the display quality and the lifespan of the EL display device 300 resulting from the thickness non-uniformity problem of the emitting layer 362 are prevented.

Figure 14:
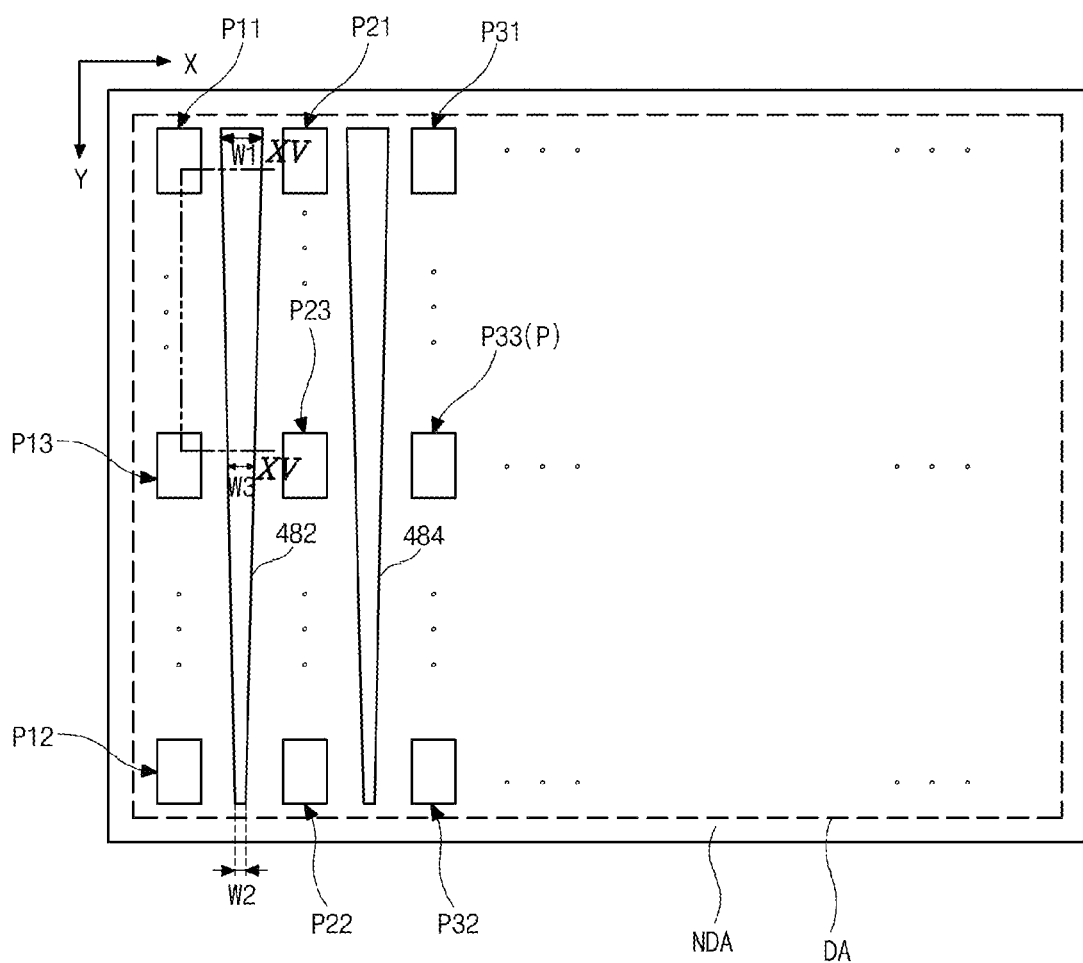
FIG. 14 is a schematic plane view of an EL display device, according to an aspect of the present disclosure.
Figure 15:
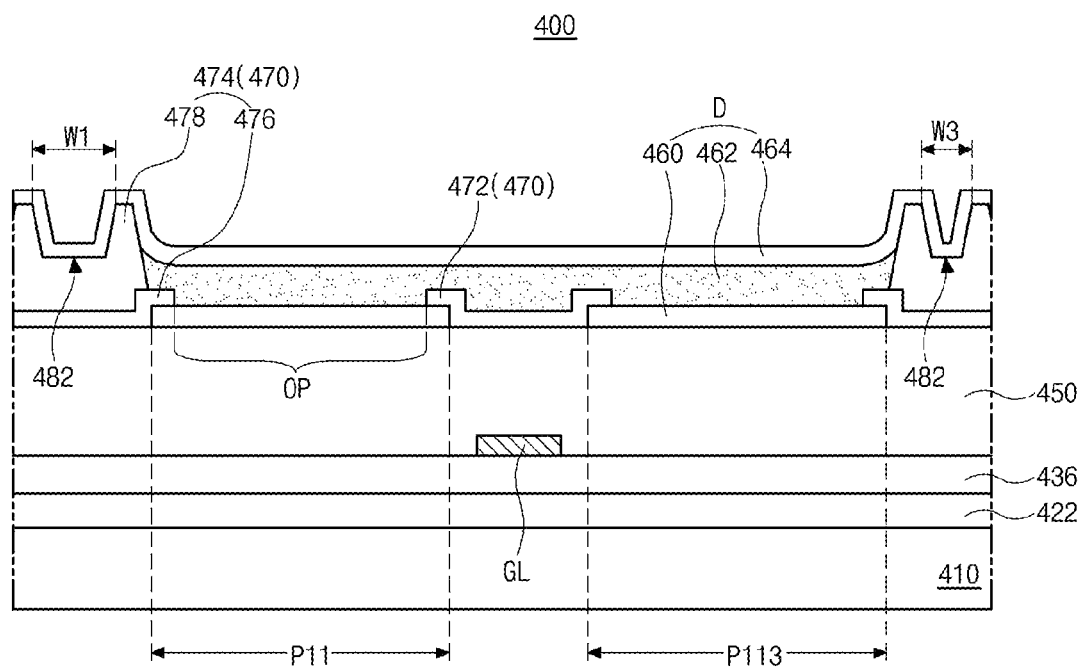
FIG. 15 is a cross-sectional view taken along the line XV-XV of FIG. 14, according to an aspect of the present disclosure.

FIG. 14 is a schematic plane view of an EL display device according to an aspect of the present disclosure. FIG. 15 is a cross-sectional view taken along the line XV-XV of FIG. 14, according to an aspect of the present disclosure.

As shown in FIGS. 14 and 15, the EL display device 400 according to the fifth embodiment of the present disclosure includes a substrate 410 where a display area DA and a non-display area NDA at a periphery of the display area DA are defined. In the display area DA of the substrate 410, a plurality of pixels P11, P12, P13 and P14 are arranged in a first pixel row along a second direction Y, and a plurality of pixels P21, P22 and P23 are arrange in a second pixel row along the second direction Y. A plurality of pixels P31, P32 and P33 are arranged in a third pixel row along the second direction Y. The second pixel row is spaced apart from the first pixel row along the first direction X, and the third pixel row is spaced apart from the second pixel row. Namely, the second pixel row is positioned between the first and third pixel rows.

The first pixel row includes a first pixel P11 at one end of the display area DA, a second pixel P12 at the other end of the display area DA and a third pixel P13 between the first and second pixels P11 and P12.

The second pixel row includes a first pixel P21 at one end of the display area DA, a second pixel P22 at the other end of the display area DA and a third pixel P23 between the first and second pixels P21 and P22.

The third pixel row includes a first pixel P31 at one end of the display area DA, a second pixel P32 at the other end of the display area DA and a third pixel P33 between the first and second pixels P31 and P32.

Namely, in each pixel row, the third pixels P13, P23 and P33 are positioned between the first pixels P11, P21 and P31 and the second pixels P12, P22 and P32.

The driving TFT Td (of FIG. 4) in each pixel P, the light emitting diode D connected to the driving TFT Td, a first groove 482 between the first and second pixel rows and the second groove 484 between the second and third pixel rows are formed on the substrate 410.

As explained with reference to FIG. 3, the driving TFT Td includes the semiconductor layer, the gate electrode, the source electrode and the drain electrode.

The gate insulating layer 422 is formed on the substrate 410, and the gate line GL is formed on the gate insulating layer 422. In addition, the interlayer insulating layer 436 and the passivation layer 450 are sequentially stacked on the gate line GL.

The first electrode 460, which is connected to the drain electrode 442 of the driving TFT Td, is formed on the passivation layer 450. The first electrode 460 may be formed of a conductive material having a relatively high work function to serve as an anode.

The bank layer 470 covering an edge of the first electrode 460 is formed on the passivation layer 450. The bank layer 470 has the opening OP corresponding to each pixel P.

The bank layer 470 includes a first bank layer 472 positioned between adjacent pixels P in the pixel row and a second bank layer 474 positioned between adjacent pixel rows. The first bank layer 472 has a thickness smaller than the second bank layer 474. The first bank layer 472 may have a single-layered structure, and the second bank layer 474 may have a double-layered structure of a first layer 476 and a second layer 478 on the first layer 476. The first bank layer 472 may be formed of the same material as the first layer 476 of the second bank layer 474.

The second layer 478 of the second bank layer 474 includes a first groove 482 between the first and second pixel rows and a second groove 484 between the second and third pixel rows.

In FIG. 15, a depth of the first groove 482 is smaller than a thickness of the second layer 478 of the second bank layer 474. Alternatively, the depth of the first groove 482 is substantially equal to or greater than the thickness of the second layer 478 of the second bank layer 474.

The plane view area (surface area) of each of the first and second grooves 482 and 484 is decreased along the first direction X. Namely, each of the first and second grooves 482 and 484 has a first width w1 corresponding to the first pixels P11, P21 and P31, a second width w2, which is smaller than the first width w2, corresponding to the second pixels P12, P22 and P32 and a third width w3, which is smaller than the first width w1 and greater than the second width w2, corresponding to the third pixels P13, P23 and P33.

In other words, the first groove 482 may include a first portion having the first width w1 along the first direction X corresponding to one end of the first pixel row, a second portion having the second width w2, which is smaller than the first width w1, along the first direction X corresponding to the other end of the first pixel row and a third portion having the third width w3, which is smaller than the first width w1 and greater than the second width w2, along the first direction X in a space between the first and second portions. As a result, in the first groove 482, the plane view area (surface area) of the third portion is smaller than that of the first portion and greater than that of the second portion.

In addition, the second groove 484 may include a first portion having the first width w1 along the first direction X corresponding to one end of the first pixel row, a second portion having the second width w2, which is smaller than the first width w1, along the first direction X corresponding to the other end of the first pixel row and a third portion having the third width w3, which is smaller than the first width w1 and greater than the second width w2, along the first direction X in a space between the first and second portions. As a result, in the second groove 484, the plane view area (surface area) of the third portion is smaller than that of the first portion and greater than that of the second portion.

The emitting layer 462 is formed on the first electrode 460. The emitting layer 462 is formed by the solution process using a liquid phase emitting material. Namely, the emitting layer 462 is formed by coating an emitting material dissolved in a solvent and drying the solvent. For example, the solution process may be an inkjet coating process, a slit coating process, a spin coating process, a printing process or a drop coating process, but it is not limited thereto.

The emitting 462 may have a single-layered structure of an emitting material layer (EML) including the emitting material. To improve an emitting efficiency of the emitting diode D, the emitting layer 462 may have a multi-layered structure of an hole injection layer (HIL), a hole transporting layer (HTL), the EML, an electron transporting layer (EIL) and an electron injection layer (EIL). The HIL and the HTL may be sequentially stacked between the first electrode 360 and the EML, and the ETL and the EIL may be sequentially stacked on the EML.

The EML may include at least one of an organic emitting material, such as a phosphorescent compound (phosphorescent emitting material) or a fluorescent compound (fluorescent emitting material), and an inorganic emitting material, such as a quantum dot. Namely, the EL display device 400 may be an organic light emitting display (OLED) device or a quantum dot light emitting display (QLED) device.

As mentioned above, since the first bank layer 472, which is positioned between adjacent pixels P in the pixel row, has a relatively small thickness, the emitting layer 462 in the pixels P of each pixel row may be connected to each other (continuous). For example, the pixels P11, P12 and P13 in the first pixel row may be one of a red pixel, a green pixel and a blue pixel.

The solvent in the emitting material solution is coated in the grooves 482 and 484 and is dried to be evaporated. Accordingly, after the emitting layer 462 is formed, there is no layer in the grooves 482 and 484 such that a portion of the second layer 478 of the second bank layer 474 is exposed through the grooves 482 and 484.

Alternatively, when the emitting material solution is coated in the grooves 482 and 484, an auxiliary material pattern (not shown) may be formed in the grooves 482 and 484.

The inkjet head (not shown) is scanned from one end (an upper side end in FIG. 14) to the other end (a lower side end in FIG. 14) to coat the emitting material solution. For example, the coating of the emitting material solution is started at the first pixels P11, P21 and P31 and is finished at the second pixels P12, P22 and P32. After the coating process is finished, the substrate 410 is transferred into the vacuum dry chamber.

The first pixels P11, P21 and P31 is present in the natural dry for a longer period than the second pixels P12, P22 and P32 and the third pixels P13, P23 and P33. However, since the plane view area (surface area) of the first and second grooves 482 and 484 is decreased along the second direction Y, the natural dry period becomes substantially same.

Namely, in the first groove 482, since the third width w3 of the third portion is smaller than the first width w1 of the first portion and greater than the second width w2 of the second portion, the solvent evaporation rate in the third portion is smaller than that in the first portion and greater than that in the second portion.

Accordingly, each pixel P has the same natural dry period regardless of the scanning direction, and the thickness non-uniformity problem of the emitting layer resulting from the scanning direction is prevented or minimized.

The second electrode 464 is formed on the emitting layer 462 in each pixel P and the bank layer 470. The second electrode 464 may be formed of a conductive material having a relatively low work function to serve as a cathode.

The second electrode 464 in each pixel P contacts the emitting layer 462, and the second electrode 464 in the first and second grooves 482 and 484 contacts the second layer 478 of the second bank layer 474. In addition, the second electrode 464 between adjacent pixels P in each pixel row contacts the first bank layer 472.

When the auxiliary material pattern (not shown) is formed in the first and second grooves 482 and 484, the second electrode 364 in the first and second grooves 482 and 484 contacts the auxiliary material pattern. Since the auxiliary material pattern dost not contact the first electrode 460, there is no emission from the auxiliary material pattern in the first and second grooves 482 and 484.

The first electrode 460, the second electrode 464 facing the first electrode 460 and the emitting layer 462 between the first and second electrodes 460 and 464 constitute the light emitting diode D.

Although not shown, an encapsulation substrate or an encapsulation film may be formed on or over the light emitting diode D to prevent penetration of moisture into the light emitting diode D. In addition, a polarization plate may be disposed on the encapsulation film to reduce an ambient light reflection. The polarization plate may be a circular polarization film.

In the EL display device 400 of the present disclosure, since the emitting layer 462 is formed by the solution process, the fabricating process of the EL display device 400 is simplified and the EL display device 400 is adequate to the large size display device.

In addition, since the solvent or the emitting material solution is coated in the grooves 482 and 484, each of which is formed between pixel rows and has a difference in the plane view area (surface area) along the scanning direction in the solution process, the thickness non-uniformity problem of the emitting layer 462 caused by the scanning direction is prevented or minimized. Accordingly, the problems in the display quality and the lifespan of the EL display device 400 resulting from the thickness non-uniformity problem of the emitting layer 462 are prevented.

It will be apparent to those skilled in the art that various modifications and variations can be made in the present disclosure without departing from the spirit or scope of the present disclosure. Thus, it is intended that the present disclosure cover the modifications and variations of this disclosure provided they come within the scope of the appended claims and their equivalents.

What is claimed is:

1. An electroluminescent display device, comprising:
   a substrate;
   a first pixel row on the substrate including a plurality of first pixels arranged along a first direction;
   a second pixel row on the substrate including a plurality of second pixels arranged along the first direction, the second pixel row being spaced apart from the first pixel row in a second direction;
   a third pixel row on the substrate including a plurality of third pixels arrange along the first direction, the third pixel row positioned between the first and second pixel rows;
   a first groove between the first and third pixel rows;
   a second groove between the second and third pixel rows; and
   a light emitting diode in each of the first pixels, the second pixels and the third pixels,
   wherein the first groove is greater than the second groove, and
   wherein the first groove is continuous from a first end of the first pixel row to a second end of the first pixel row.

2. The electroluminescent display device according to claim 1, wherein in the second direction, the first groove has a width greater than the second groove.

3. The electroluminescent display device according to claim 1, wherein a length of the first groove is substantially equal to a length of the first pixel row, and a length of the second groove is substantially equal to a length of the second pixel row.

4. The electroluminescent display device according to claim 1, further comprising:
   a fourth pixel row spaced apart from the second pixel row in the second direction including a plurality of fourth pixels arranged along the first direction; and
   a third groove between the second and fourth pixel rows,
   wherein the third groove has a width smaller than the second groove.

5. The electroluminescent display device according to claim 1, further comprising:
   a thin film transistor on the substrate and in each of the plurality of first pixels, the plurality of second pixels and the plurality of third pixels;
   an insulating layer on the thin film transistor; and
   a bank layer on the insulating layer and surrounding each of the plurality of first pixels, the plurality of second pixels and the plurality of third pixels,
   wherein the light emitting diode includes a first electrode, an emitting layer on the first electrode and a second electrode covering the emitting layer, and
   wherein the first and second grooves are formed in the bank layer.

6. The electroluminescent display device according to claim 5, further comprising:
   a material pattern in the first and second grooves,
   wherein the material pattern is configured to contact the insulating layer and the second electrode.

7. The electroluminescent display device according to claim 5, wherein the second electrode in the first and second grooves is configured to contact the insulating layer.

8. The electroluminescent display device according to claim 5, wherein the bank layer includes a first bank layer positioned between the plurality of first pixels having a first thickness and a second bank layer positioned between the first pixel row and the third pixel row and having a second thickness, and wherein the second thickness is greater than the first thickness.

9. The electroluminescent display device according to claim 8, wherein the first bank layer has a single-layered structure, and the second bank layer has a double-layered structure.

10. The electroluminescent display device according to claim 8, wherein the emitting layers in the first pixels are connected to each other, and the emitting layers in the first and second pixels are separated.

11. An electroluminescent display device, comprising:
    a substrate;
    a first pixel row on the substrate including a plurality of first pixels arranged along a first direction;
    a second pixel row on the substrate including a plurality of second pixels arranged along the first direction, the second pixel row being spaced apart from the first pixel row in a second direction;
    a third pixel row on the substrate including a plurality of third pixels arrange along the first direction, the third pixel row positioned between the first and second pixel rows;
    a first groove between the first and third pixel rows;
    a second groove between the second and third pixel rows;
    a light emitting diode in each of the first pixels, the second pixels and the third pixels;
    a thin film transistor on the substrate and in each of the plurality of first pixels, the plurality of second pixels and the plurality of third pixels;
    an insulating layer on the thin film transistor; and
    a bank layer on the insulating layer and surrounding each of the plurality of first pixels, the plurality of second pixels and the plurality of third pixels,
    wherein the first groove is greater than the second groove,
    wherein the light emitting diode includes a first electrode, an emitting layer on the first electrode and a second electrode covering the emitting layer,
    wherein the first and second grooves are formed in the bank layer,
    wherein the bank layer includes a first bank layer positioned between the plurality of first pixels having a first thickness and a second bank layer positioned between the first pixel row and the third pixel row and having a second thickness, and wherein the second thickness is greater than the first thickness.

12. The electroluminescent display device according to claim 11, wherein the first bank layer has a single-layered structure, and the second bank layer has a double-layered structure.

13. The electroluminescent display device according to claim 11, wherein the emitting layers in the first pixels are connected to each other, and the emitting layers in the first and second pixels are separated.

14. An electroluminescent display device, comprising:
a substrate;
first to nth pixel rows on the substrate, each of the first to nth pixel rows including a plurality of pixels arranged along a first direction, the first to nth pixel rows being spaced apart from each other in a second direction;
first to (n−1)th grooves disposed between the first to nth pixel rows, respectively; and
a light emitting diode in each of the pixels,
wherein the first groove is closest to a first edge of the substrate, and the (n−1)th groove is closest to a second edge of the substrate,
wherein n is an integer of 4 or more,
wherein when n is 5 or more, each of the second to (n−2)th grooves is smaller than the first groove and greater than the (n−1)th groove,
wherein n is 4, the second groove is smaller than the first groove and greater than the (n−1)th groove, and
wherein the second groove has a uniform area from one end of a second pixel row to the other end of the second pixel row.

15. The electroluminescent display device according to claim 14, wherein in the second direction,
when n is 5 or more, each of the second to (n−2)th grooves has a width smaller than the first groove and greater than the nth groove, and
when n is 4, the second groove has a width smaller than the first groove and greater than the (n−1)th groove.

16. The electroluminescent display device according to claim 14, wherein the first groove is continuous from a first end of the first pixel row to a second end of the first pixel row.

17. The electroluminescent display device according to claim 14, further comprising:
a thin film transistor on the substrate and in each of the plurality of pixels;
an insulating layer on the thin film transistor; and
a bank layer on the insulating layer and surrounding each of the plurality of pixels,
wherein the light emitting diode includes a first electrode, an emitting layer on the first electrode and a second electrode covering the emitting layer, and
wherein the first to (n−1)th grooves are formed in the bank layer.

18. The electroluminescent display device according to claim 17, wherein the bank layer includes a first bank layer positioned between the plurality of pixels having a first thickness and a second bank layer positioned between the first to nth pixel rows and having a second thickness, and
wherein the second thickness is greater than the first thickness.

19. The electroluminescent display device according to claim 18, wherein the first bank layer has a single-layered structure, and the second bank layer has a double-layered structure.

* * * * *